United States Patent
Hassani et al.

(10) Patent No.: US 7,859,846 B2
(45) Date of Patent: Dec. 28, 2010

(54) LOW THERMAL RESISTANCE POWER MODULE ASSEMBLY

(75) Inventors: Vahab Hassani, Denver, CO (US); Andreas Vlahinos, Castle Rock, CO (US); Desikan Bharathan, Arvada, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 442 days.

(21) Appl. No.: 11/569,248

(22) PCT Filed: Oct. 18, 2005

(86) PCT No.: PCT/US2005/037137
§ 371 (c)(1),
(2), (4) Date: Aug. 12, 2008

(87) PCT Pub. No.: WO2007/001414
PCT Pub. Date: Jan. 4, 2007

(65) Prior Publication Data
US 2009/0213546 A1    Aug. 27, 2009

Related U.S. Application Data

(63) Continuation-in-part of application No. 11/032,771, filed on Jan. 11, 2005, now Pat. No. 7,190,581.

(51) Int. Cl.
*H05K 7/20* (2006.01)
(52) U.S. Cl. .................. 361/702; 361/679.53; 361/704; 361/699; 165/80.3; 165/80.41; 62/259.2
(58) Field of Classification Search ............ 361/679.46, 361/679.47, 679.53, 688, 689, 698, 699, 361/702–712, 714, 715, 717–722; 165/80.2, 165/80.3, 80.4, 80.5, 46, 146, 104.33, 104.34, 165/185; 257/713, 714, 723, 731, 678, 789, 257/796; 174/15.1, 16.3, 252; 62/259.2; 29/890.03, 521, 557, 505, 840
See application file for complete search history.

(56) References Cited

U.S. PATENT DOCUMENTS 2,942,165 A    6/1960  Jackson et al.
3,917,370 A *  11/1975 Thornton et al. ............ 439/194

(Continued)

FOREIGN PATENT DOCUMENTS

FR    2 639 764      6/1982
JP    409121557 A    5/1997
JP    411163572 A    6/1999

(Continued)

OTHER PUBLICATIONS

International Search Report for International (PCT) Application for PCT/US05/37137, mailed Mar. 1, 2007.

(Continued)

*Primary Examiner*—Michael V Datskovskiy
(74) *Attorney, Agent, or Firm*—Paul J. White; John C. Stolpa; Mark D. Trenner

(57) ABSTRACT

A power module assembly (400) with low thermal resistance and enhanced heat dissipation to a cooling medium. The assembly includes a heat sink or spreader plate (410) with passageways or openings (414) for coolant that extend through the plate from a lower surface (411) to an upper surface (412). A circuit substrate (420) is provided and positioned on the spreader plate (410) to cover the coolant passageways. The circuit substrate (420) includes a bonding layer (422) configured to extend about the periphery of each of the coolant passageways and is made up of a substantially nonporous material. The bonding layer (422) may be solder material which bonds to the upper surface (412) of the plate to provide a continuous seal around the upper edge of each opening (414) in the plate. The assembly includes power modules (430) mounted on the circuit substrate (420) on a surface opposite the bonding layer (422). The power modules (430) are positioned over or proximal to the coolant passageways.

20 Claims, 19 Drawing Sheets

U.S. PATENT DOCUMENTS

| | | | |
|---|---|---|---|
| 5,262,921 A | | 11/1993 | Lamers |
| 5,926,372 A | * | 7/1999 | Rinehart et al. ............. 361/704 |
| 6,141,219 A | * | 10/2000 | Downing et al. ............ 361/704 |
| 6,400,012 B1 | | 6/2002 | Miller et al. |
| 6,414,867 B2 | * | 7/2002 | Suzuki et al. ............... 363/141 |
| 6,473,303 B2 | | 10/2002 | Kaufmann |
| 6,738,253 B2 | | 5/2004 | Beuille et al. |
| 6,892,796 B1 | * | 5/2005 | Nagashima et al. ........ 165/80.4 |
| 6,960,278 B2 | | 11/2005 | Petitbon et al. |
| 6,992,887 B2 | | 1/2006 | Jairazbhoy et al. |
| 2006/0108098 A1 | | 5/2006 | Stevanovic et al. |

FOREIGN PATENT DOCUMENTS

| | | |
|---|---|---|
| JP | 02001168256 A | 6/2001 |
| WO | 81-03734 | 12/1981 |

OTHER PUBLICATIONS

International Preliminary Report on Patentability and Written Opinion for International (PCT) Application for PCT/US05/37137, issued Jul. 17, 2007.

Supplementary European Search Report for European Patent Application No. 05 85 8240, completed Apr. 28, 2008.

* cited by examiner

LOW THERMAL RESISTANCE POWER MODULE ASSEMBLY

CROSS-REFERENCE

This application is a continuation-in-part of U.S. patent application Ser. No. 11/032,771, filed Jan. 11, 2005, now U.S. Pat. No. 7,190,581 which is incorporated herein in its entirety by reference.

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

BACKGROUND

There continues to be a growing demand for power semiconductor or integrated circuit (IC) modules and other electric elements with higher power density, higher reliability, and improved cost effectiveness. Miniature power and electric modules are used extensively in a range of applications including automobiles, hard drives, data storage devices, and nearly any electronic product. These power and electric modules often operate at high voltage and current which causes them to generate a large amount of heat, which causes the modules to become hot. For proper operation, the power and electric modules or elements need to be maintained below predefined operating temperatures to avoid performance degradation or failure, such as 125° C. for many power modules but the desired operating temperature may vary with the particular application. However, the goals of miniaturization and increased performance are in conflict with effective thermal management because higher power demands result in greater heat generation while increased module density reduces the size of cooling surfaces. As a result, cooling problems plague all electronic systems and are particularly troubling in electronic systems utilizing IC power modules, such as Insulated-Gate Bipolar Transistors (IGBTs), power metal-oxide-semiconductor field-effect transistors (MOSFETs), and the like.

Electronic component designers have a number of options for attempting to dissipate or remove heat generated by an electronic circuit, such as a power module, but none have adequately met the demands for higher performance with reduced size. Designers may use convection to remove heat by transferring heat away from the electric components with airflow. This is useful for small portable devices such as cell phones but is not as effective for power modules that are tightly spaced in enclosed spaces such as are present in automobiles and other products. In these cases, convection is supplemented or replaced by conduction in which heat is wicked or transferred away from the hot or higher temperature electronic circuit or power module to cool or lower temperature components that contact or abut the electronic circuit or the substrate upon which the circuit is mounted. Typically, a coolant may be used to remove heat from the lower temperature components, e.g., water or another fluid may be pumped over a portion of components contacting the base of the electronic circuit to maintain a lower temperature. In such conductive designs, increased heat transfer has typically been obtained by increasing the rate at which heat is transferred from the electronic circuit, as measured by the heat transfer coefficient of the electronic circuit or power module assembly. Unfortunately, such techniques of increasing the heat transfer coefficient have not been able to keep pace with the demand for increased module density and have caused many modules to be designed to operate at levels below performance capacity, e.g., at reduced power levels.

A specific example of an electronic system that must be designed for operating within an acceptable temperature range and therefore, for heat dissipation, is an IC power module assembly such as an IGBT device. FIGS. 1-3 illustrate a conventional design for a power module assembly 100. As shown, the power module assembly 100 includes a heat sink 110 made up of a spreader plate 112 and a number of channel walls (or heat transfer fins) 114. A cooling medium or coolant, such as water, is pumped through the walls 114 contacting the walls 114 and spreader plate 112 and removes heat from the heat sink 110 as the inlet coolant, $C_{IN}$, is at a lower temperature than the outlet coolant, $C_{OUT}$. The assembly 100 also includes a circuit substrate 120 that is mounted on the spreader plate 112 of the heat sink 110 and a power or circuit module 130 that is mounted on the circuit substrate 120. The power module 130 is shown in FIG. 3 to include a circuit layer, e.g., a silicon die with an IGBT, power MOSFET, or the like, 136 and a connection or joint layer 132, such as solder or other joining materials, for joining or mounting the circuit layer to the circuit substrate 120. Heat that is generated in the power module 130 is conducted through the circuit substrate 120 and heat sink 110 to the flowing coolant.

The thermal resistance of the power module assembly 100 depends mainly on the thermal resistance of the spreader plate 112 and circuit substrate 120. The circuit substrate 120 may take a number of forms, but in the case of an IGBT power module assembly 100, often take the form of a Direct Bonded Copper (DBC) substrate that is thermally bonded to the heat sink 110. In this example, as shown in FIG. 3, the circuit substrate 120 is thermally bonded to the spreader plate 112 with a thermal bonding layer 122 that typically would be thermal grease or paste. The circuit substrate 120 includes a ceramic isolation layer 126, such as layer of AlN or other ceramic material, sandwiched between two conductive layers, such as layers of copper or the like, 124, 128. As can be appreciated, maintaining the temperature of the power module 130 requires heat to be conducted through the bonding layer 132 of the power module 130, through the circuit substrate 120 including the thermal bonding layer 122, and through the spreader plate 112.

Attempts to improve the heat exchange characteristics of power module assemblies, such as assembly 100, have not been entirely effective requiring power (and corresponding heat) produced by the power module to be limited. Most conventional techniques have concentrated on increasing the heat transfer rate or coefficient on the fluid side on surface 114, such as by employing micro channels, by using extensions from the spreader plate (such as the channel walls or fins 114 in heat sink 110 of FIGS. 1 and 2), or by using other techniques to improve heat transfer effectiveness of the power module assembly.

Hence, there remains a need for improved designs for dissipating heat generated by electronic circuits, such as power modules. Preferably, such improved designs would be compatible with existing module designs and manufacturing techniques and would significantly reduce the thermal resistance between the component generating the heat and the heat sink and/or coolant.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

The preferred embodiment discloses a power module assembly with low thermal resistance, comprising: a heat sink plate with a lower surface and an upper surface, the heat sink plate comprising a plurality of passageways for coolant extending from the lower surface to the upper surface; a circuit substrate positioned on the heat sink plate covering the coolant passageways, wherein the heat sink plate further comprises a recessed surface on the upper surface extending continuously about the periphery of one or more of the coolant passageways; a sealing member positioned in the recessed surface of the heat sink plate, the sealing member comprising a compressible material; and a set of power modules mounted on the circuit substrate opposite a bonding layer.

Another embodiment discloses an electronic assembly with low thermal resistance comprising a metallic spreader plate including a lower surface and an upper surface, a heat dissipation opening extending through the plate from the upper surface to the lower surface, and a stress resistant element adjacent the heat dissipation opening; a circuit substrate; a bonding and sealing layer disposed between the circuit substrate and the plate and bonding the circuit substrate to a portion of the upper surface of the plate adjacent the stress resistant element and to a bonding surface of the stress resistant element proximate to the heat dissipation opening; and an electric component layer positioned on the circuit substrate comprising an integrated circuit (IC) for generating heat during operation, the heat being removed at least in part through the circuit substrate to a cooling medium in the heat dissipation opening, wherein the bonding and sealing layer blocks flow of the cooling medium between the circuit substrate and the plate.

A method of manufacturing a power module assembly is also disclosed with low thermal resistance, comprising providing a power module substrate comprising or including a plurality of power modules distributed in a pattern on a circuit substrate, the circuit substrate comprising a pair of electrical conductor layers with a ceramic isolation layer sandwiched between; providing a metallic plate having a thickness, based on the power module pattern, making a hole through the thickness of the plate for each of the power modules; forming a groove in an upper surface of the plate about the periphery of one or more of the holes; positioning a sealing member in the groove; and mating the plate to the power module substrate, wherein the holes in the plate are substantially aligned with the power modules with a central axis of the holes substantially aligned with a center of one of the power modules, the bonding comprising applying a sealing force to a portion of the circuit substrate to compress the sealing member and achieve a liquid seal between the upper surface of the plate and the circuit substrate.

The preferred embodiment addresses the above problems by providing an electronic component assembly that is configured for low thermal resistance (e.g., reduced by more than 50 percent or more compared to convention devices) between a coolant or cooling medium and an electronic component or power module, such as a surface mounted device (SMD), an IGBT substrate, a MOSFET, an IC or printed circuit board or layer, or the like. The assembly generally achieves this reduction by providing a heat sink or spreader plate that includes a coolant passageway or opening for each module that is to be mounted on the heat sink or plate. The passageway or opening extends through the thickness of the heat sink or plate such that coolant can flow through the passageway or opening to more directly dissipate heat. A circuit substrate, such as a DBC substrate, is mounted to the plate with bonding material, such as solder or other nonporous material, providing a seal against flow of the coolant between the substrate and the plate. In this manner, coolant is able to directly contact the bottom layer of the circuit substrate rather than only contacting the plate, which requires heat to be conducted through the plate and any bonding layer (such as thermal grease). The electronic component or power module is then mounted or bonded to the circuit substrate so as to be positioned generally opposite (or over) the passageway or opening, thereby providing a relatively direct path between the heat-generating module and portions of the circuit substrate contacting the coolant flowing in the passageway or plate opening. In this manner, thermal resistance can be reduced 50 percent or more when compared with more conventional, solid spreader plate designs.

More particularly, a power module assembly is provided with lower thermal resistance to enhance heat dissipation to a coolant. The assembly includes a heat sink plate with a lower surface and an upper surface. Significantly, the plate also includes a number of passageways for coolant that extend from the lower surface to the upper surface of the plate. A circuit substrate is included in the assembly and positioned on the heat sink plate so as to cover the coolant passageways. The circuit substrate includes a bonding layer that is configured to extend about the periphery of each of the coolant passageways and is made up of a substantially nonporous material. In one embodiment, the bonding layer is solder or a similar material which bonds to the upper surface of the plate to provide a continuous seal around the upper edge of each opening or passageway in the plate. The assembly also includes a set of power modules, such as IGBT modules, that are mounted on the circuit substrate on a surface opposite the bonding layer. Each of the power modules is preferably positioned on the substrate to be over or proximal to one of the coolant passageways. The passageways may have a variety of cross sectional shapes but in one embodiment, the passageways are circular in cross section and may be tapered with a smaller diameter at the upper surface of the plate than at the lower surface.

According to another aspect of the preferred embodiment, a method is provided for manufacturing power module assemblies having reduced thermal resistance. The method includes providing a power module substrate that has a plurality of power modules distributed in a pattern on a circuit substrate. The circuit substrate is made up of a pair of electrical conductor layers, e.g., copper layers, that sandwich a ceramic isolation layer (e.g., AlN or similar ceramic). To provide this power module substrate, the method may include providing silicon dies with IGBTs or other power circuits and a DBC substrate and then bonding (e.g., soldering) the modules to the substrate with the silicon dies arranged in the module pattern. The method also includes providing a plate made or other material that can be bonded to the circuit substrate. Then, based on the power module pattern, a hole is punched, cut, or otherwise formed or made through the thickness of the plate for each of the power modules. The method continues with applying a bonding material to an upper surface of the plate (or the layer can be applied prior to the hole formation step). The bonding material is applied in a continuous manner (i.e., without gaps) about the periphery of each hole in the plate. The plate is then bonded to the power module substrate with the bonding material. For example, if the bonding material is solder material, the bonding material is heated and then later cooled to affect bonding. During the bonding, the holes in the plate are aligned with the power modules to provide a relatively direct heat transfer path from the modules to coolant in the holes. For example, the central axis of the holes may be aligned with the center of each of the power modules. Preferably, in this method, the bonding material is selected to be substantially nonporous to liquids such as the coolant so as to form a liquid-tight seal between the upper surface of the plate and the mating electrical conductor layer.

In the above-described embodiments, a direct bond copper (DBC) layer or other circuit substrate is attached to a heat sink or plate with coolant passageways through a bonding process. The bonding material could be solder or any other bonding material which is non-porous and is sealably bonded to or mated with the DBC and the heat sink plate. This bonding provides a seal against the coolant flowing along the heat sink opening wall and upper surface and stops the coolant from leaking or seeping through the gap between the DBC and plate and coming into contact with the power modules. In some applications, a bonding process that creates a rigid bond may result in high stress levels if the power module assembly experiences high temperature swings such as 125° C. down to −40° C. in a short period of time. The stress levels may surpass the yield strength of the bonding material and cause lamination of the bonding material.

With these thermal induced stresses in mind, another aspect of the preferred embodiment involves a method for manufacturing a power module assembly such that a stress relief mechanism or stress resistant element or member, such as a structural element with bellows, are built into the base or spreader plate. In this process, circular or square shape bellows are constructed around each hole or around a plurality of holes to allow the base plate free movement during high temperature swings.

In another aspect of the preferred embodiment, a fabrication method is provided that includes punching, cutting, or otherwise forming a hole or passageway for coolant through the thickness of the base plate for each of the power modules. The method continues with cutting a groove on the upper surface of the base plate for receiving a sealing member (such as a gasket or O-ring). The groove is cut out in a continuous manner (i.e., without gaps) about the periphery of each hole in the plate or about a set of the holes. The groove is then filled with a high temperature O-ring or gasket or other sealing member. Then, the circuit substrate and power modules are placed on top of the base plate typically with the center of each module aligned with the centerline axis of each hole or coolant passageway. Appropriate pressure points are designed or provided for each substrate to press (such as with a continuous seal force transmitting structural member or wall or with a plurality of such structural elements) the substrate against the base plate so the O-rings, gaskets, or other sealing members are able to seal the coolant. In this manner, this proposed configuration of a power module assembly uses O-rings, gaskets, or the like instead of bonding material such as solder to achieve an effective liquid seal. Depending on the configuration and size of the substrate, a plurality of two, three, or more IGBTs can be grouped together and one groove with an O-ring or gasket may be used to seal them from the coolant flow path.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

The preferred embodiment is directed to electronic system design in which electric circuit elements or modules, such as IC power modules or other circuit elements that generate heat during use, are more effectively cooled by significantly reducing thermal resistance between the electric circuit element and a coolant or cooling medium. In exemplary embodiments of electric circuit assemblies the electric circuit element or module is typically an IC that is provided in a die such as a silicon die and is mounted, e.g., soldered, to an electric circuit substrate, e.g., a DBC substrate. The electric circuit substrate is in turn mounted upon a heat sink such as a spreader plate and during operation, a cooling medium or coolant is forced to flow adjacent and in contact with the heat sink to remove heat from the electric circuit assembly.

Figure 1:
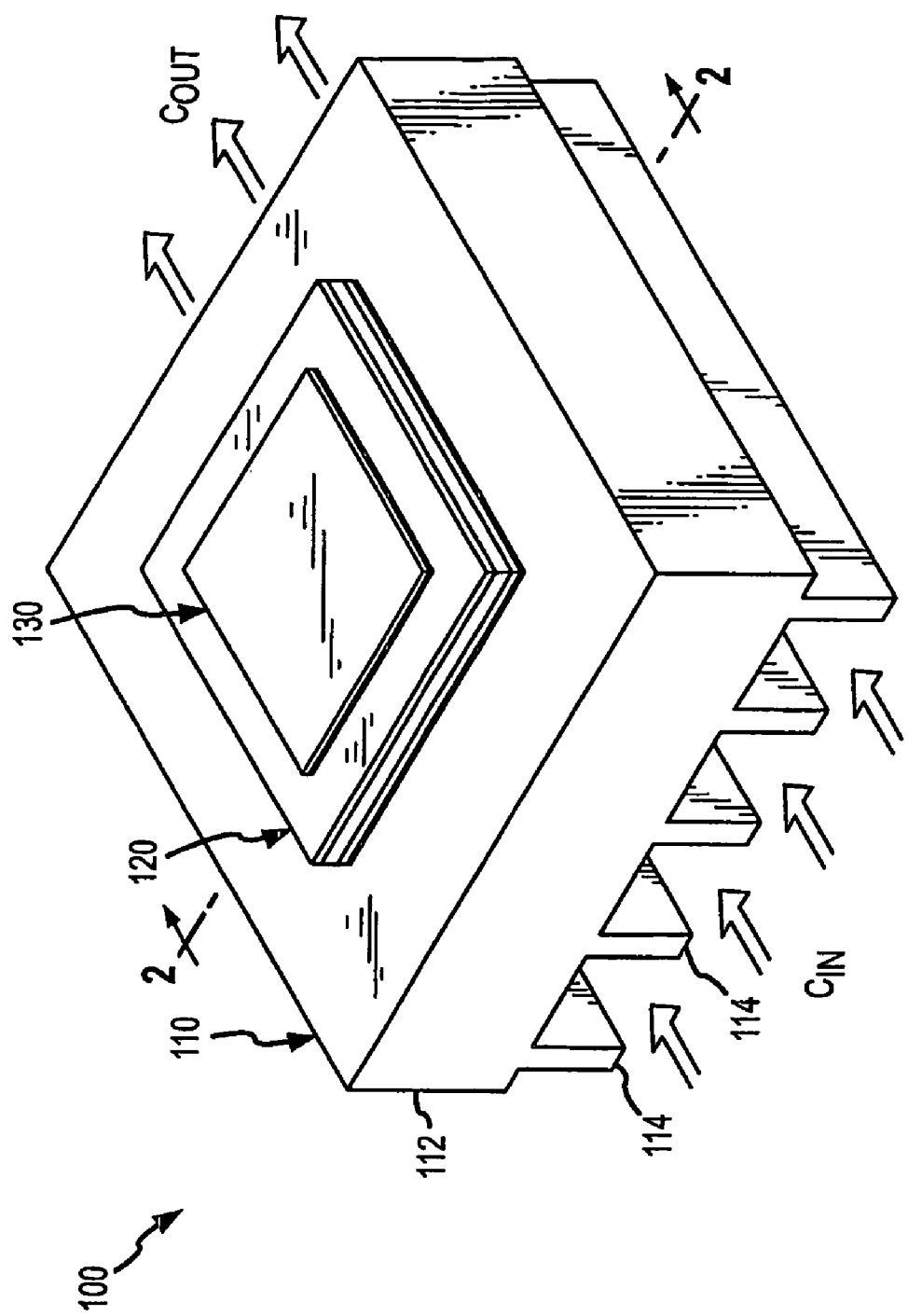
FIG. 1 is a perspective view of a prior art power module assembly utilizing a cooling medium or coolant to conduct heat away from a power module through a circuit substrate and spreader plate.
Figure 2:
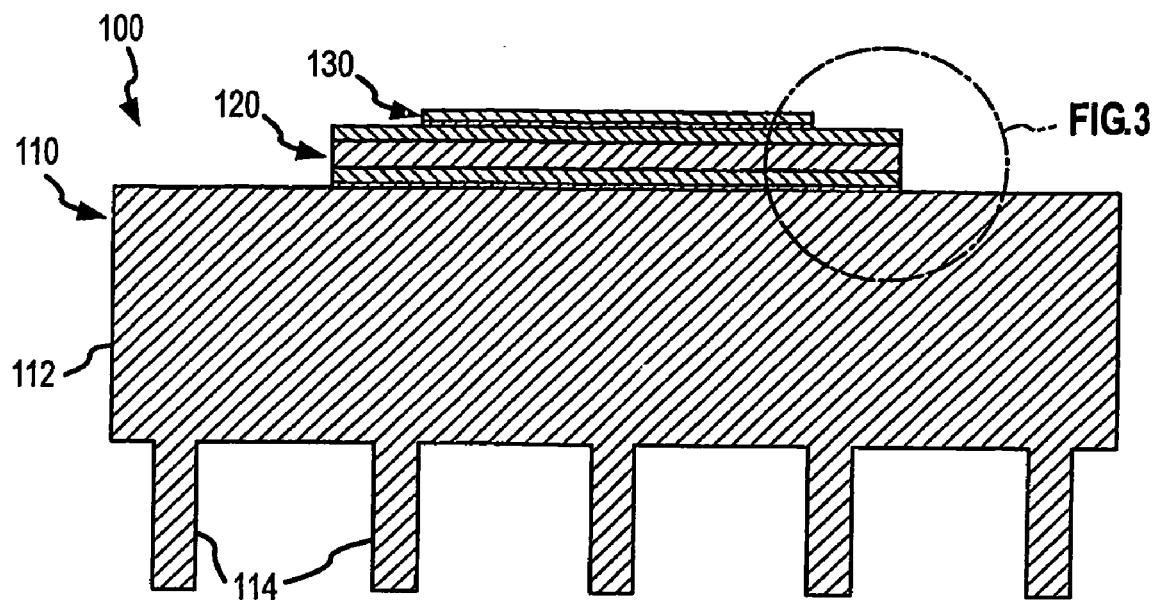
FIG. 2 is a cross sectional view of the power module assembly of FIG. 1 taken at line 2-2.
Figure 3:
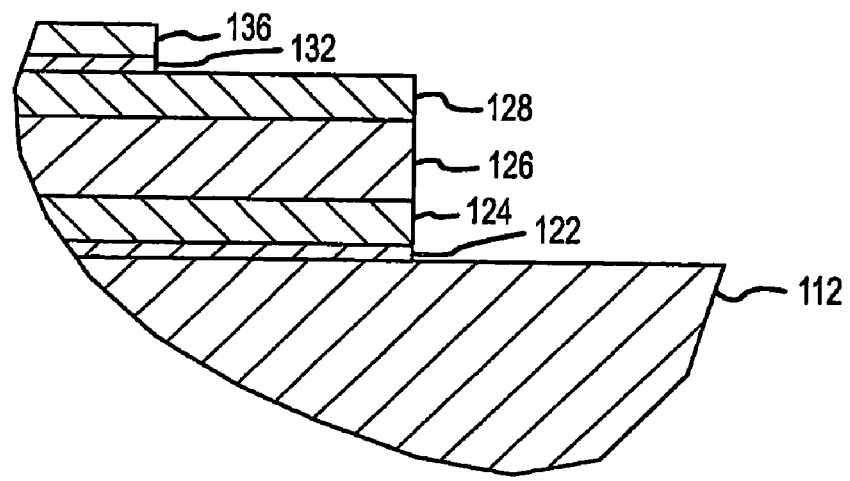
FIG. 3 illustrates in more detail a portion of the power module assembly of FIG. 2 illustrating layers of power module assembly through which heat must flow to be dissipated from the electric circuit or power element i.e., the portions of the power module assembly contributing to the thermal resistance of the prior art power module assembly.

According to one feature of the preferred embodiment, a coolant passageway or heat dissipation opening is provided through (or nearly through) the heat sink to directly expose a surface of the electric circuit substrate to the coolant (such as a surface beneath at least a portion of the electric circuit element). As a result, the thermal resistance of the electric circuit assemblies is significantly reduced when compared with prior assemblies, such as that shown in FIGS. 1-3, because the thermal resistance of the heat sink or spreader plate is removed (or at least significantly reduced) as is the heat resistance due to the thermal grease or paste typically used to mount a DBC substrate to a spreader plate. According to another feature of the preferred embodiment, coolant is able to directly contact the electric circuit substrate, e.g., a DBC substrate, in part because a water-tight seal is provided between the heat sink or spreader plate and the electric circuit substrate. This is achieved by providing a bonding layer in the electric circuit substrate that not only bonds the substrate to the heat sink but also provides a seal that blocks the coolant from passing. Many non-porous materials and bonding techniques may be used, and in some embodiments the bonding and sealing layer of the electric circuit substrate is solder material as the substrate is soldered to the heat sink in a continuous manner about the periphery of the coolant passageway or heat dissipation opening in the heat sink.

In the following discussion, the preferred embodiment is explained in detail with reference to power module assemblies rather than more general electronic circuit assemblies. This is done for ease of explanation rather than as limiting the preferred embodiment to power module applications. It will be understood by those skilled in the art that the concepts of the preferred embodiment can readily be applied to nearly any electronic application in which an electric element such as an IC is generating excessive heat that needs to be effectively dissipated. A specific application of the preferred embodiment is for providing effective heat dissipation from IGBTs which are used extensively in the electronics industry, but again, IGBTs are just one example of power modules that may be cooled with the features of the preferred embodiment. FIGS. 4-14 illustrate a single power module but, as shown, in FIGS. 15-17, the concepts discussed with reference to the single power modules of FIGS. 4-14 are readily applicable to more conventional configurations or designs with multiple power modules or circuit elements (such as diodes and the like).

Figure 4:
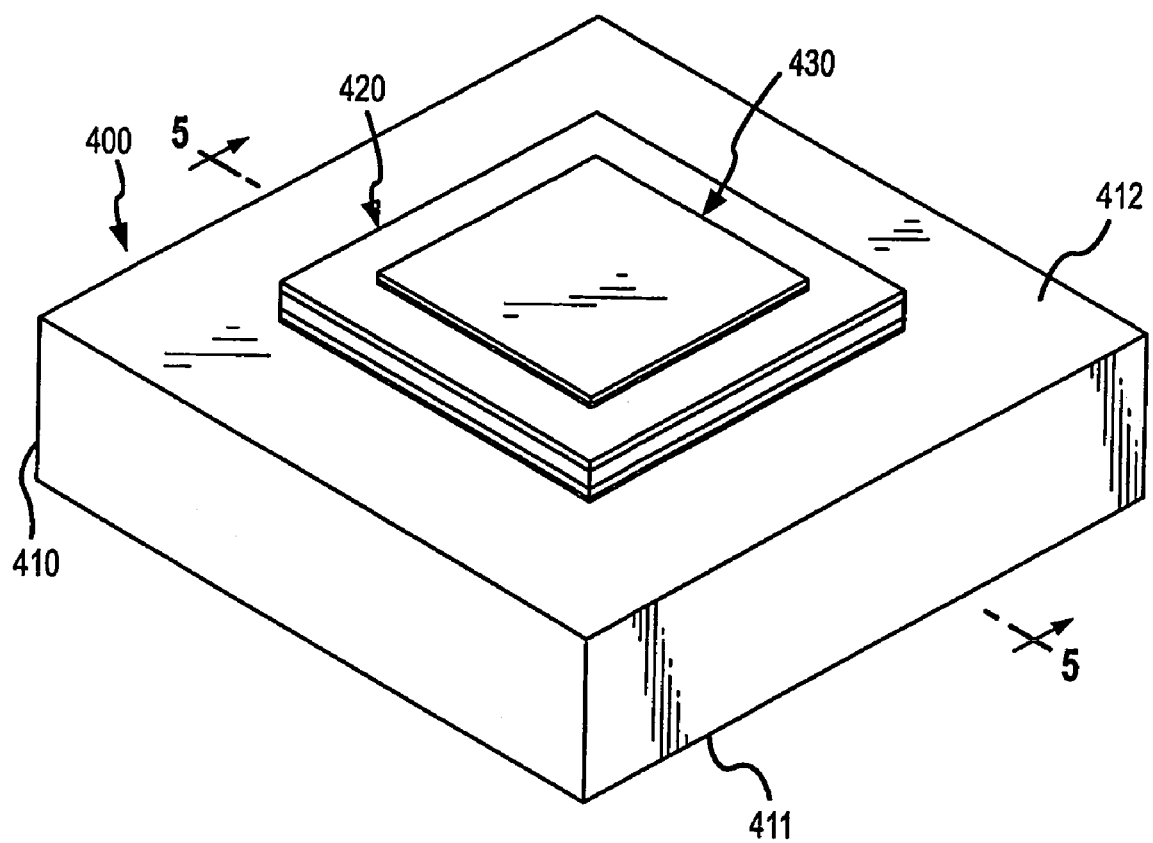
FIG. 4 is a perspective view of a power module assembly configured with low thermal resistance.

FIG. 4 illustrates an exemplary power module assembly 400. The power module assembly 400 includes a heat sink (which is in the following discussion used interchangeably with spreader plate) 410. A circuit substrate 420 is mounted upon an upper surface 412 of the spreader plate 410, and as shown, a power module 430 is mounted upon the circuit substrate 420. The power module assembly 400 would typically be implemented singly or with other assemblies 400 (not shown) with electrical and other connections (not shown) to the power module 430 and/or circuit substrate 420. As with the assembly 100 of FIG. 1, a coolant or cooling medium, such as water or other fluid, would be forced to flow adjacent the lower surface 411 of the spreader plate 410 to carry away heat generated by operation of the power module 430.

Figure 5:
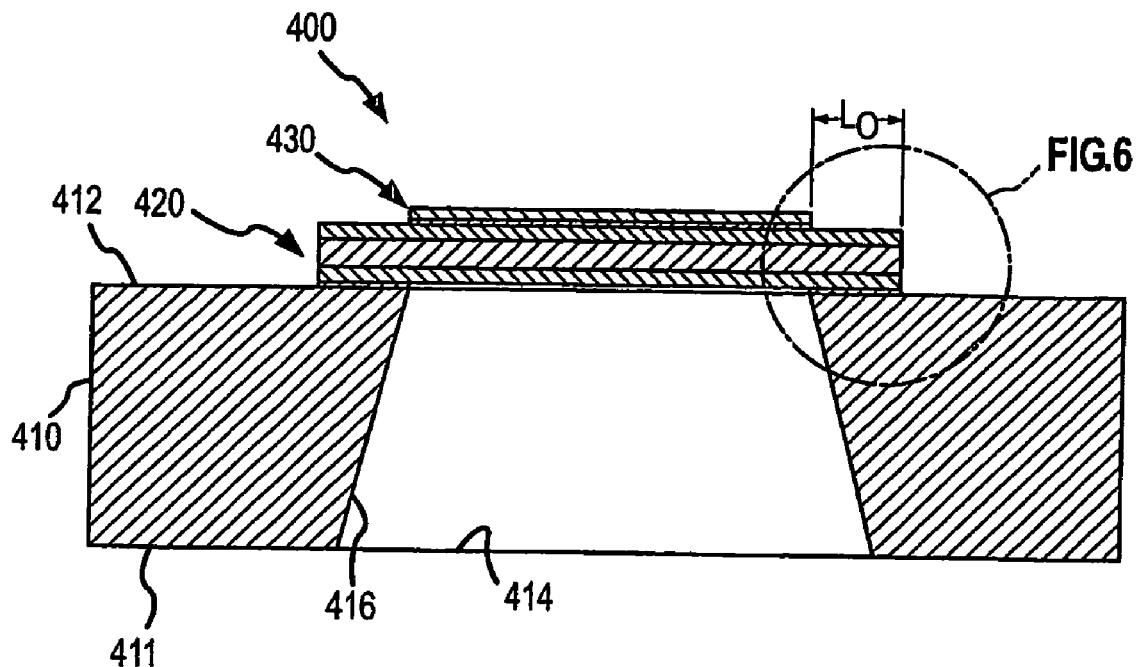
FIG. 5 is a cross section of the power module assembly of FIG. 4 taken at line 5-5 illustrating modification of the spreader plate or heat sink to include an opening allowing coolant to contact the circuit substrate (e.g., DBC substrate)

FIG. 5 illustrates a cross section of the power module assembly 400. As can be appreciated, heat that is generated in the power module 430 is conducted for removal through the abutting circuit substrate 420 to the spreader plate 410. As shown, the spreader plate 410 configuration differs from that of conventional spreader plates, such as plate 112 of FIG. 1, as it is configured to direct coolant flow to contact directly the circuit substrate. To this end, the spreader plate 410 includes a coolant passageway or heat removal opening 414 that allows coolant (not shown) to flow from the lower surface 411 of the plate 410 to the upper surface 412 of the plate 410 so as to contact the circuit assembly 420. In this manner, at least a portion of the heat generated by the power module 430 is removed from the electric substrate 420 directly to the flowing coolant rather than having to pass through the thickness of the spreader plate 410. As shown, the passageway or opening 414 is typically positioned within the power module assembly 400 to be beneath or adjacent the portion of the circuit substrate 420 on which the power module 430 is mounted. In other words, the passageway 414 is positioned such that there is a relatively direct path from the power module 430 through the substrate 420 to the coolant contacting the substrate 420.

The passageway or opening 414 may take many forms, shapes, and sizes to practice. As shown, the opening 414 is generally circular at the lower and upper surfaces 411, 412 and includes a single wall 416 that slopes inward from the lower surface 411 to the upper surface 412 such that the opening 414 has a larger diameter at the lower surface 411 than at the upper surface 412 (e.g., to better control coolant flow and allow smoother return flow from the electric substrate 420). The size of the opening 414 at the upper surface 412 is, of course, selected to be smaller than the abutting or adjacent portion of the electric substrate 420 to provide an overlapping length, $L_O$, of the substrate 420 contacting the upper surface 412 about the periphery of the substrate 420 (this is shown as one dimension but may differ about the periphery in other embodiments). The size of the overlapping portion of the substrate 420 as measured by the length, $L_O$, may be selected to obtain a desired exposure of the substrate 420 to the coolant flowing in the opening 414 and also to provide a desired structural strength (e.g., to avoid cracking due to stresses occurring because of deflection and the like). For example, if the substrate 420 has dimensions of 10 mm by 10 mm adjacent the plate 410, the diameter of the opening 414 at the upper surface 412 may be selected to be about 9 mm or less such that the length, $L_O$, of the overlapping or overhanging portion of the substrate 420 is at least about 0.5 mm. Additionally, in other embodiments, the opening 414 may be more cylindrical with a wall 416 that is generally perpendicular to the substrate 420 and/or may have differing cross sectional shapes such as oval or a multi-sided or polygonal shape.

Figure 6:
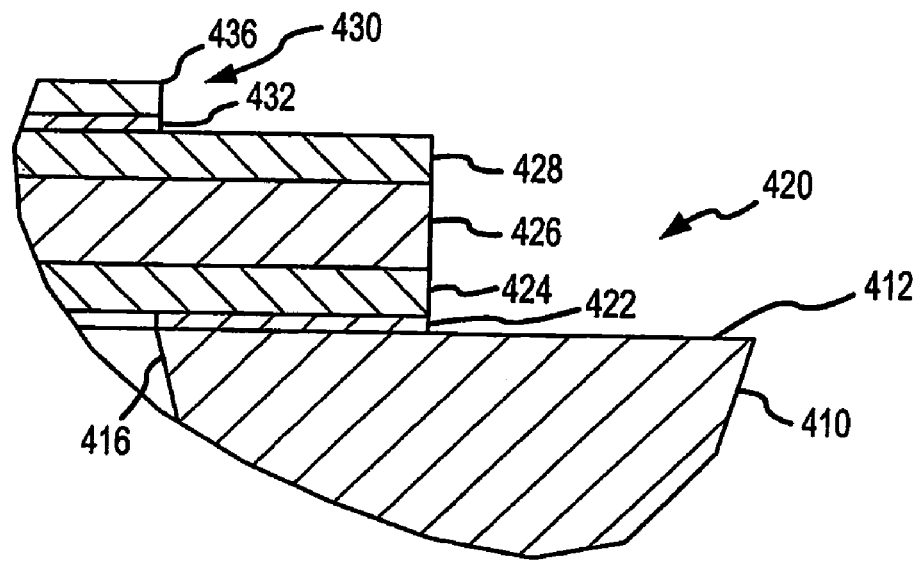
FIG. 6 is a detailed view of a portion of the power module assembly of FIG. 5 showing the layers of the power module assembly and sealed or water-tight connection of the circuit substrate to the spreader plate.
Figure 7:
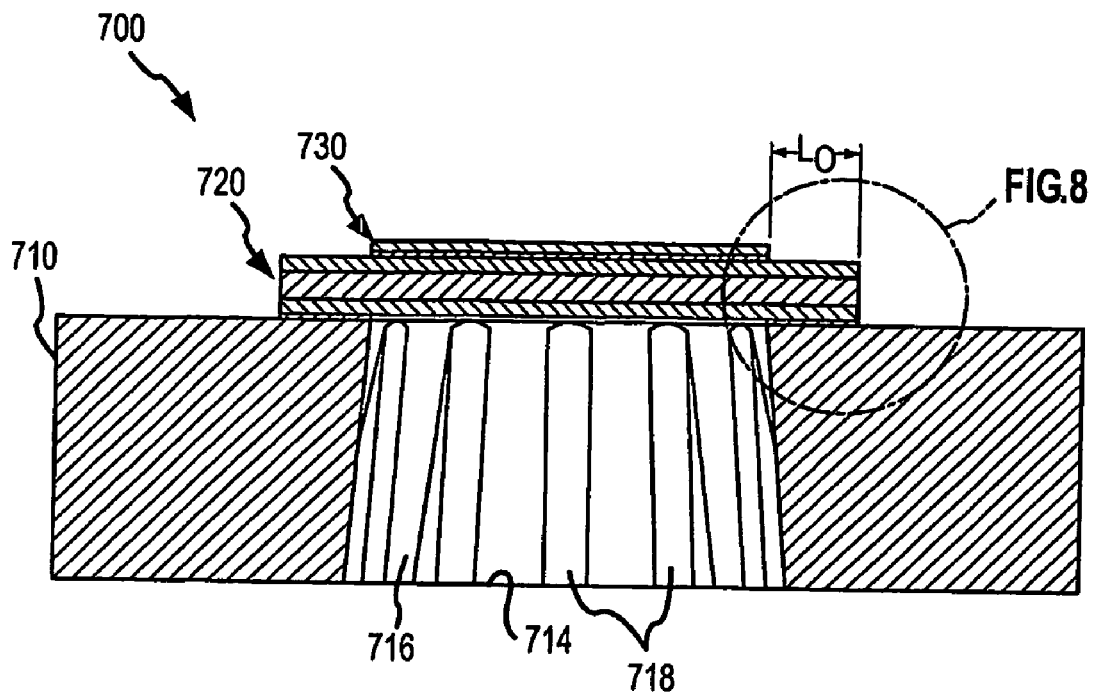
FIG. 7 is a cross sectional view similar to that of FIG. 5 of an alternative embodiment of a power module assembly.
Figure 8:
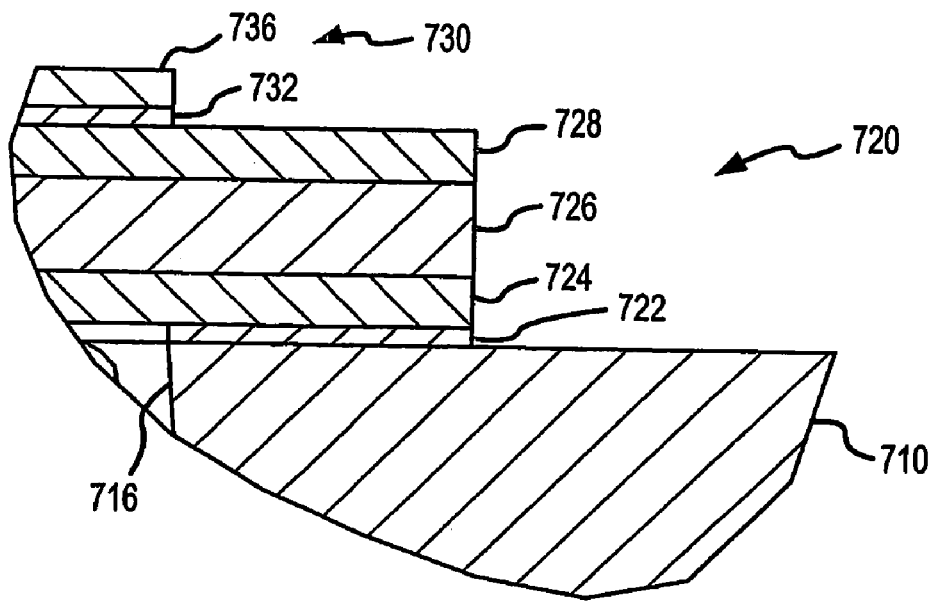
FIG. 8 is a detailed view of a portion of the power module assembly of FIG. 7 similar to that of FIG. 6.
Figure 9:
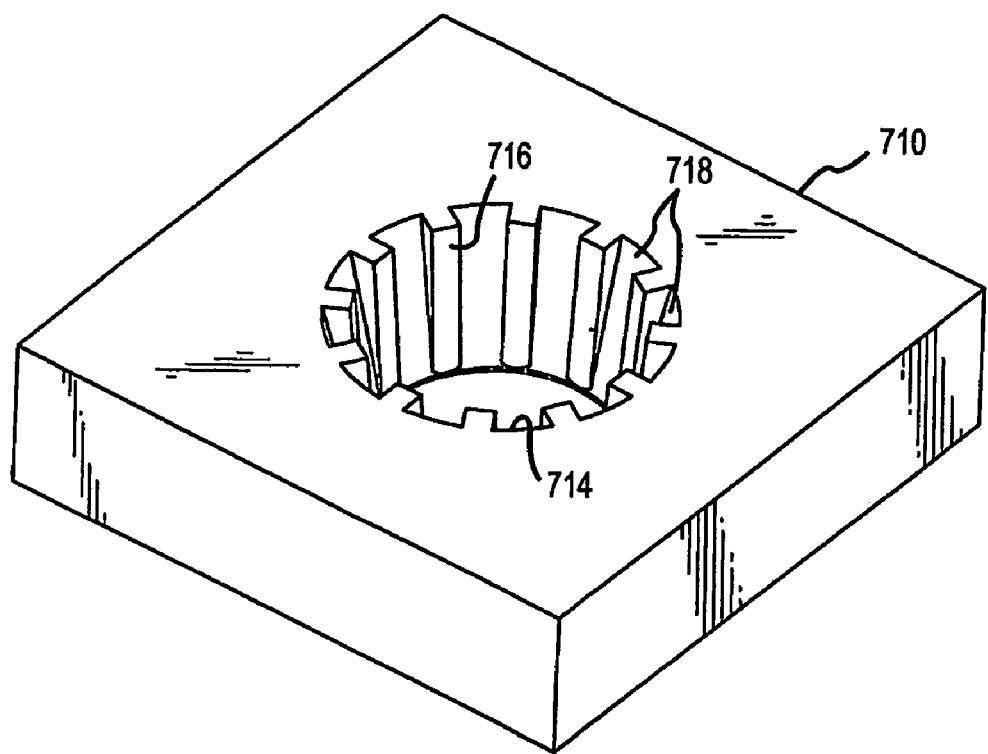
FIGS. 9 and 10 are a perspective and a top view, respectively, of the spreader plate or heat sink of the alternative power module assembly of FIGS. 7 and 8 showing in more detail the alternative configuration of a coolant opening or passageway in the plate or heat sink.
Figure 10:
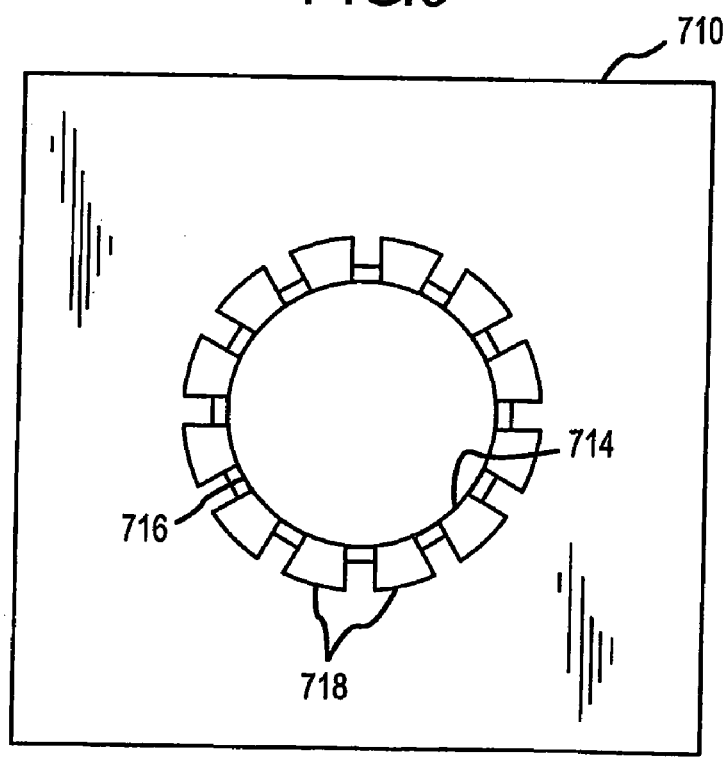

FIG. 6 illustrates a more detailed view of a portion of the power module assembly 400 including mating portions of the circuit substrate 420 and spreader plate 410 (i.e., the overlapping portion). The power module 430 is shown to include a circuit layer or die layer 436 that includes the circuit or electric component, such as an IGBT, and is often made up of an IC in a silicon die. The power module 430 further includes a bonding layer 432 for bonding the circuit layer 436 to the circuit substrate 420, and the bonding layer 432 in one embodiment is made up a solder material, as the circuit layer 436 is soldered to the circuit substrate. Here and elsewhere in this description the term "solder" is used in the general sense used within the electronics industry and includes a range of readily meltable metals and alloys used to solder or bond one metal or metal element to another.

As discussed above, an important feature of the preferred embodiment is that the circuit substrate 420 is sealably bonded to or mated with the upper surface 412 of the spreader plate or heat sink 410 such that coolant flowing along plate wall 416 cannot leak or seep through and contact the power module 430. In this regard, the circuit substrate 420 includes a bonding layer 422 made up of a nonporous material that rigidly bonds or mates the substrate 420 to the upper surface 412. In one embodiment, the substrate 420 is soldered to the upper surface 412, and in this case, the bonding layer 422 is made of solder or solder material that is mated to the upper surface 412 and to the adjacent layer of the substrate 420. The bonding layer 422 extends about the entire periphery of the opening 414 typically adjacent the wall 416 at the upper surface 412 so as to provide a continuous seal or dam against coolant in the opening 414. For example, as shown, the substrate 420 may be a DBC or similar substrate with two conductive layers 424, 428 (such as copper or the like) and a ceramic isolation layer 426, which may be made up of AlN or other ceramic materials. The upper copper or conductive layer 428 is in turn bonded to the power module 430 by the bonding layer 432 (e.g., layer of solder material). Note, FIGS. 5 and 6 are not drawn to scale to allow the bonding layers 422 and 432 to be more readily illustrated and these layers 422, 432 are typically much thinner than the other layers of the module 430 and substrate 420, with the specific thicknesses of the various layers of the power module assembly 400 not being limiting.

As shown, some of the heat generated from the power module 430 may pass through the substrate 420 to the plate 410. In this regard, the bonding layer 422 is preferably selected to have a relatively high thermal conductivity coefficient to enhance this heat transfer, e.g., is formed of a metal, metal alloy or the like such as a solder material. However, because a much larger amount of the generated heat is dissipated from the lower conductive or copper layer 424 directly to the coolant in the passageway 414, the use of a metal or other low thermal resistance materials for the bonding layer 422 is not a required feature of the preferred embodiment.

FIGS. 7-10 illustrate another embodiment of a power module assembly 700. As shown, the power module assembly 700 is similar to assembly 400 of FIG. 4-6 in that it includes a spreader plate 710 that is sealably bonded to a circuit substrate 720 upon which a power module 730 is mounted. The power module 730 again includes a circuit or die layer 736 and a bonding layer 732, such as a solder layer, for mating the power module to the circuit substrate 720. The circuit substrate 720 includes a coolant-tight bonding layer 722 that sealably bonds the substrate 720 to the upper surface of the spreader plate 710. As shown, the substrate 720 includes an isolation layer 726 (e.g., a layer of ceramic or other electric isolator material) sandwiched between a lower conductor layer 724 and an upper conductor layer 728. The conductor layers 724, 728 may include a thickness of copper or other electric conductors, with the upper layer 728 mating with the bonding layer 732 of the power module 730. The lower conductor layer 724 mates with the bonding layer 722 and has a portion of its lower surface (i.e., a portion not mating with the bonding layer 722) exposed or open to the passageway 714 and any coolant therein. In this manner, coolant in the passageway 714 can directly exchange heat with substrate 720 through the lower conductor layer 724. Again, the size of the passageway 714 in the plate 710 is smaller at the upper surface of the plate 710 than the abutting substrate 720 to provide an overlapping or overhanging portion of the substrate 720 with a length, $L_O$, that provides adequate sealing surface and structural strength.

The power module assembly 700 differs from the power module assembly 400 in the configuration of its heat sink or spreader plate 710. The spreader plate 710 includes a coolant passageway or heat dissipation opening 714 that extends through the thickness of the plate 710 as does the opening 414 of plate 410 but with a modified wall surface to provide an enhanced heat transfer rate. As shown, the opening 714 includes a wall 716 that extends from the lower surface to the upper surface of the plate 710 at an angle such that the opening 714 is smaller at the upper surface (i.e., the surface of the plate 710 that abuts the circuit substrate 720) than at the lower surface. In the wall 716, a plurality of recessed surfaces 718 are provided so as to increase the heat transfer surface area of the wall 716 that contacts coolant within the passageway 714 and/or to increase heat transfer rates by causing a desired coolant flow pattern. The cross section of the recessed surfaces 718 may vary to practice the preferred embodiment and may take the trapezoidal form shown or take another shape, such as triangular, semicircular, or the like, with the shape often being selected to support efficient manufacturing techniques.

Figure 11:
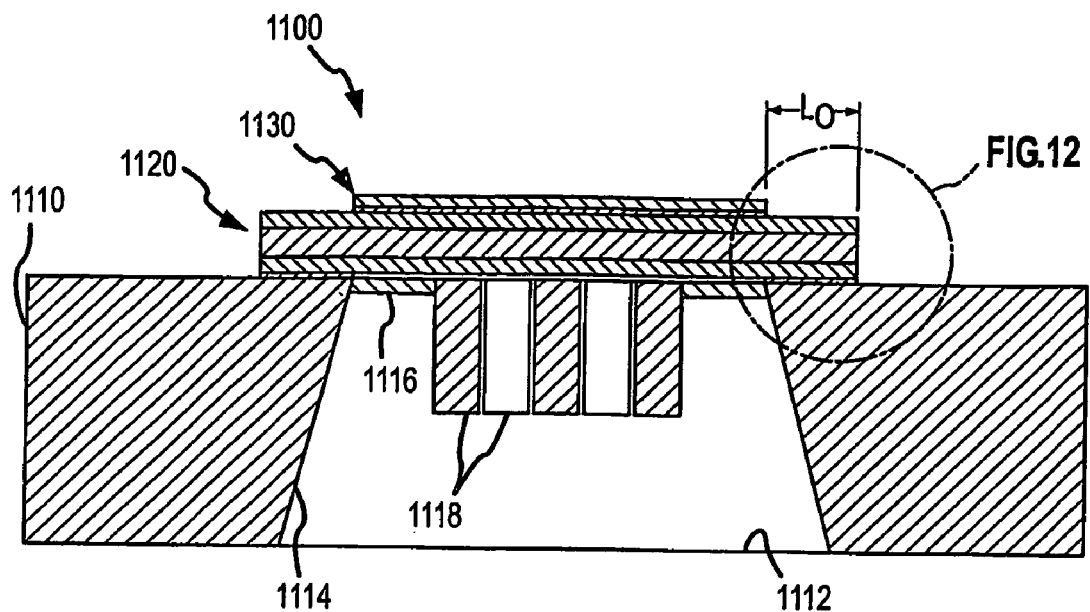
FIG. 11 is a cross sectional view similar to that of FIG. 5 of another alternative embodiment of a power module assembly.
Figure 12:
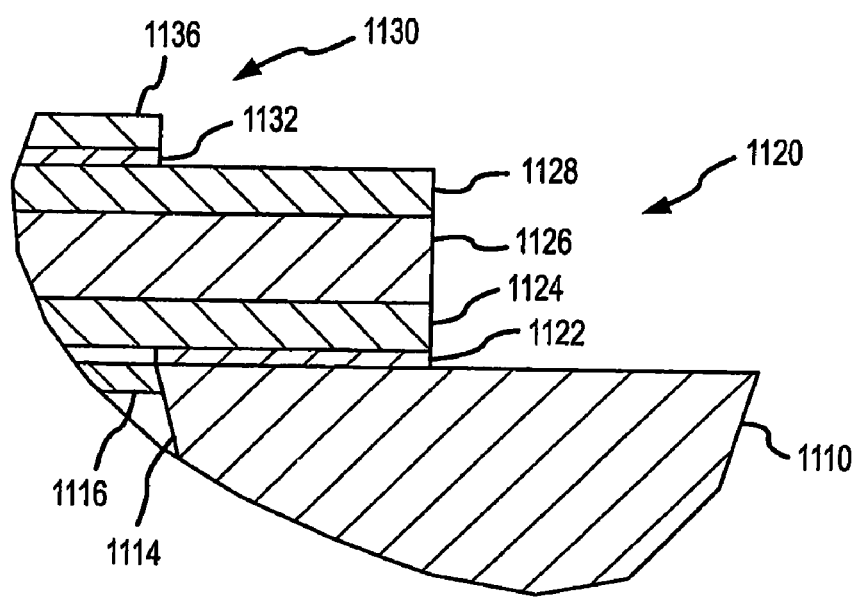
FIG. 12 is a detailed view of a portion of the power module assembly of FIG. 11 similar to that of FIG. 6.
Figure 13:
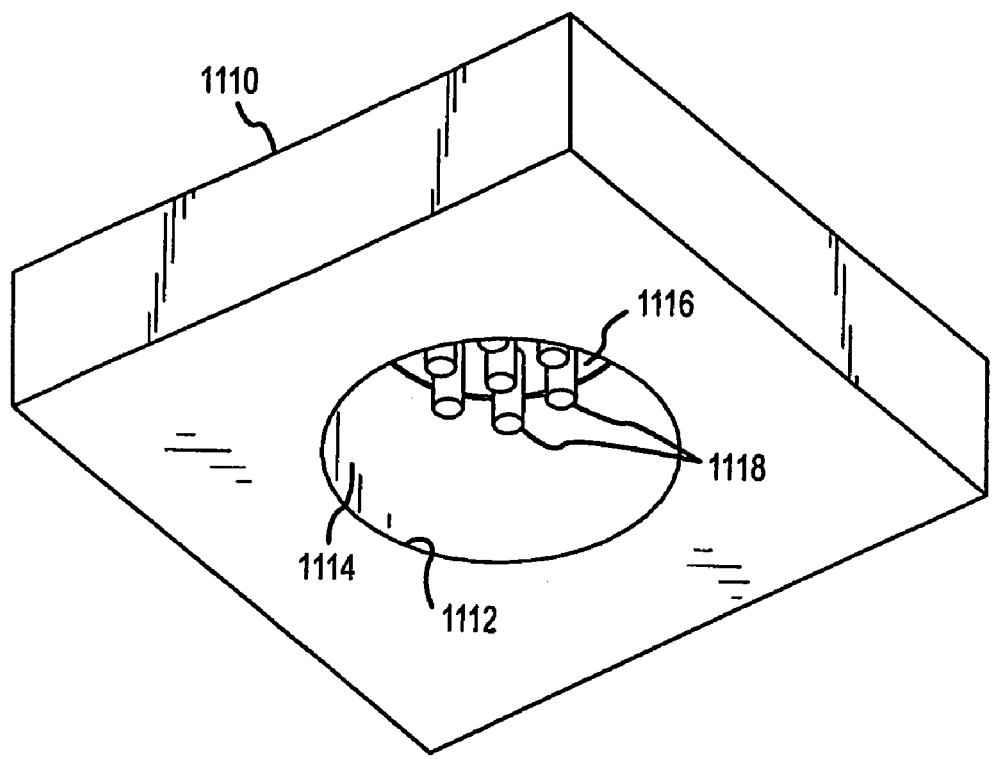
FIGS. 13 and 14 are a perspective view and a top view, respectively, of the spreader plate or heat sink of the assembly of FIG. 11 showing in more detail the provision of a heat transfer base in the coolant opening or passageway and heat transfer extensions, e.g., columns in the illustrated example.
Figure 14:
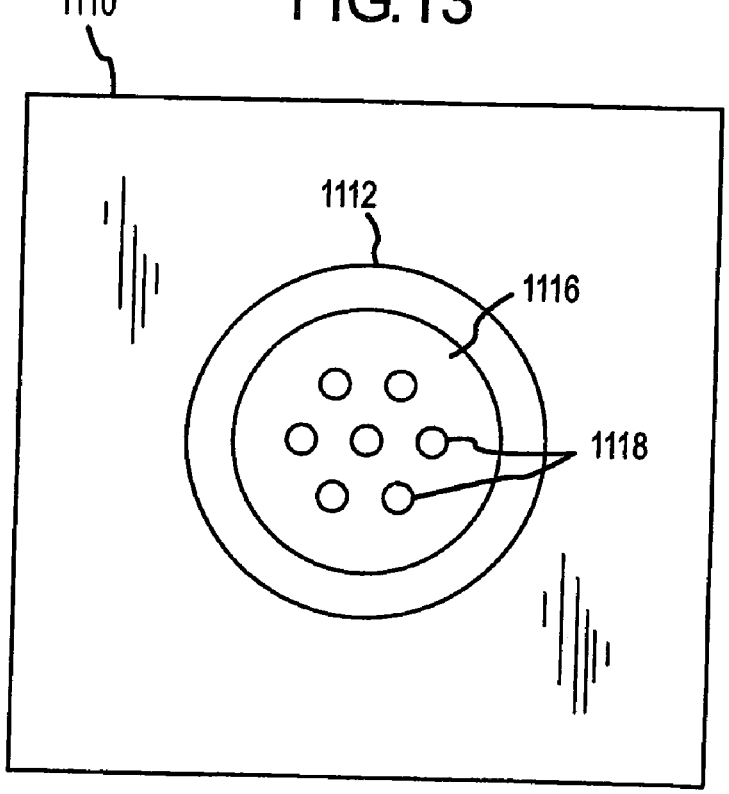

FIGS. 11-14 illustrate another power module assembly 1100 that provides low thermal resistance between a power module 1130 and coolant flowing adjacent a heat sink or spreader plate 1110. As shown in FIG. 11, the power module assembly 1100 includes a power module 1130, such as an IGBT, mounted upon a circuit substrate 1120, such as a DBC substrate, that is in turn mounted upon a spreader plate 1110. As with the other assemblies 400, 700, a passageway or opening 1112 is provided in the spreader plate 1110 to reduce thermal resistance by bringing coolant or a cooling medium into closer proximity to the power module 1130. In contrast to the other passageways, however, the passageway 1112 is shown to not extend completely through the thickness of the plate 1110 but instead extends substantially through the thickness of the plate 1110 to form a heat transfer plate or base 1116 that contacts the circuit substrate 1120.

More specifically, the power module 1130 includes a circuit or element layer 1136, such as silicon die or IC chip, and a bonding layer 1132 to mate it with the circuit substrate 1120. The circuit substrate 1120 includes a pair of conductor layers 1128, 1124 sandwiching an electric isolation layer 1126, such as a layer of ceramic or other insulation material. A bonding layer 1122 is provided to mate the substrate 1120 with an upper surface of the plate 1110, and in some embodiments, the bonding layer 1122 is made up of solder material (but, of course, other materials may be used for the bonding layer 1122 to provide the desired bonding and sealing features) as the substrate 1120 is soldered to the upper surface of the plate 1110, which as with the other plates typically is formed from a metal suited for bonding by soldering in this example (if other bonding materials are used, the material used for plate 1110 may be selected to be compatible with that bonding material and bonding technique).

As shown, in FIGS. 11-14, the plate 1110 includes a passageway or opening 1112 with a wall 1114 configured similarly to wall 416 of assembly 400 in that it slopes inward from a lower to an upper surface of the plate 1110, whereby the opening 1112 is larger at the lower surface of the plate than the upper surface. As illustrated, a heat transfer base or plate 1116 is formed at the upper end of the passageway 1112. In other words, the passageway 1112 does not in this illustrated embodiment extend through the plate 1110 and coolant does not directly contact the substrate 1120. Upon the base 1116, a plurality of cooling rods or extensions 1118 are formed and extend outward from the base 1116 into the passageway 1112. In this embodiment, heat generated by the power module 1130 is conducted through the layers of the circuit substrate 1120 for dissipation to coolant in the passageway 1112 via portions of the plate 1110 and mainly through the base 1116 and rods/extensions 1118. The number, size, orientation, and spacing of the rods or extensions 1118 may vary with seven being shown for illustration purposes only.

In a variation of the assembly 1100 not shown, the base 1116 is removed or not provided with coolant being allowed to pass through the passageway or opening 1112 to contact the circuit substrate 1120 directly. In this variation, the bonding layer 1122 again acts as a seal between coolant in the passageway 1112 and the power module 1130 as coolant is allowed to directly contact the substrate 1120 (i.e., directly contact lower conductor layer 1124). In this embodiment, the cooling rods or extensions 1118 protrude or extend directly from the lower conductor layer 1124, and may be formed during the assembly of the substrate 1120 or formed separately and later bonded (e.g., soldered) to the layer 1124.

The above description and corresponding figures describe power module assemblies having a single power module (or electric circuit or electric component) that is configured with low thermal resistance. It may now be useful to describe fabrication of a low thermal resistance electric circuit assembly that includes a plurality of electric circuit modules, which may include a variety of IC chips or the like such as power components, diodes, and the like. This manufacturing technique is suitable for producing chip set products such as power module assemblies with multiple IGBTs, diodes, and/or other IC chips or components, e.g., 2×9 (or other configuration) chip sets available from SEMIKRON or other electronics companies.

Figure 15:
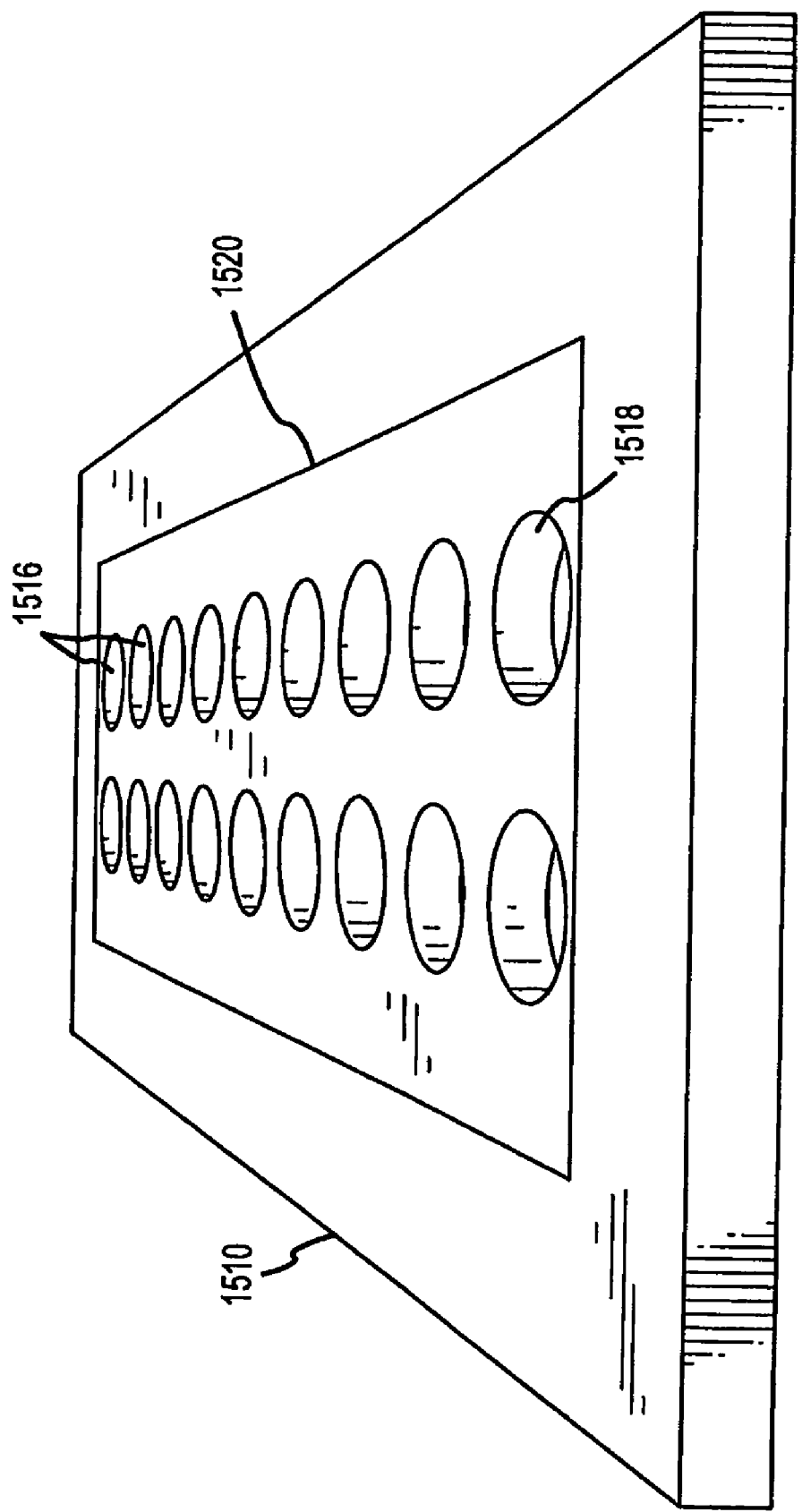
FIG. 15 illustrates a spreader plate or heat sink of a IGBT or power module assembly configured for multiple power modules or circuit elements with multiple coolant passageways or openings and also showing an applied bonding and sealing layer, such as solder or other nonporous material.
Figure 16:
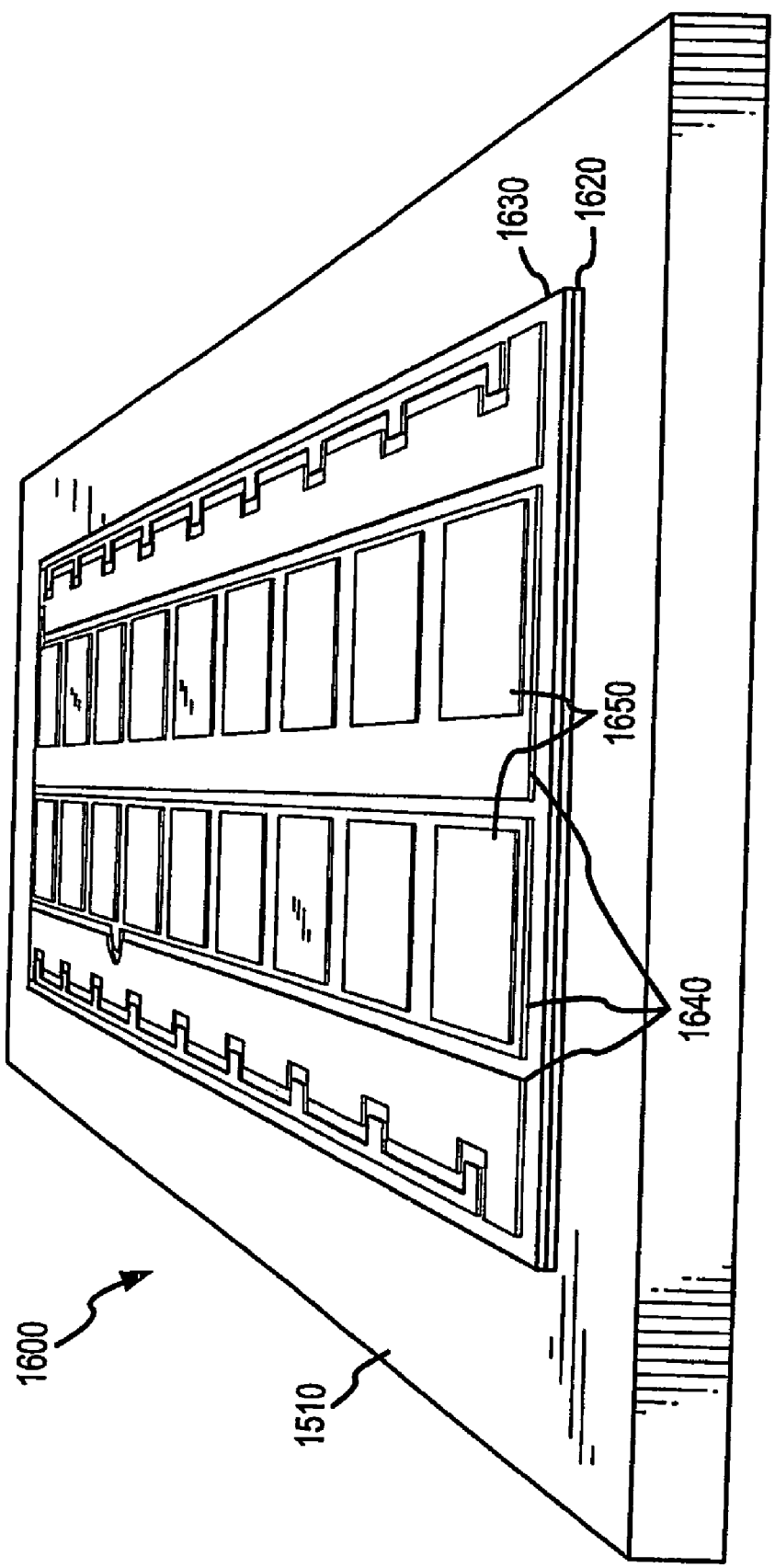
FIG. 16 illustrates the spreader plate of FIG. 16 after a circuit substrate such as a DBC has been mounted and after a number of power modules or other electric circuit components have been bonded to the circuit substrate proximal to the coolant passageways.

In this regard, FIGS. 15 and 16 illustrate the production of a 2×9 chip set assembly 1600 according to the preferred embodiment with low thermal resistance between electric modules (such as power modules, diodes, and the like) and a coolant (not shown). FIG. 15 illustrates a spreader plate (or heat sink) 1510, which is typically made of materials with high thermal conductivity such as a metal or metal alloy. The number of modules to be cooled is determined, and then, fabrication continues with punching or otherwise providing holes, openings, or passageways 1516 for each module to be cooled by the spreader plate 1510. As shown, eighteen holes or passageways 1516 with sidewalls 1518 are cut or punched through the entire thickness of the plate 1510. The sidewalls 1518 are shown to be perpendicular to the top surface of the plate 1510 but in other embodiments the sidewalls 1518 may be sloped as shown in FIGS. 4-14 and at this point in production, heat transfer enhancing elements may also be provided, such as those shown in FIGS. 7-14. The positioning of the openings 1516 is selected to match the planned or mapped location of the electronic component modules or chips, e.g., with the center of each of the openings 1516 substantially aligning with a center of an overlying module or chip.

Because during use a coolant is allowed to flow through the passageways or openings 1516, the manufacturing method includes mating a circuit substrate with the spreader plate 1510 in a manner that not only provides bonding but provides a seal about the periphery of the openings 1516 that blocks the flow of the coolant. With this in mind, FIG. 15 illustrates that a layer of bonding and sealing material 1520 is applied to the spreader plate 1510. In one embodiment, the layer of bonding and sealing material 1520 is made up of a thin layer of soldering material that is applied to abut or be immediately adjacent the sidewalls 1518 of the openings 1516 (or to even cover a portion of the wall 1518). In some cases, the bonding and sealing layer 1520 is applied to the plate 1510 and then, the holes 1516 are cut or punched to ensure adequate coverage of the bonding and sealing material, e.g., soldering material or the like.

With the bonding layer 1520 in place, the other components of the assembly 1600 may be positioned and bonded to the plate 1510. In some embodiments, the other components/layers are produced as a single assembly and then, bonded (e.g., soldered) to the plate 1510. In other embodiments, one or more layers is applied separately. As shown, these other components include a circuit substrate or stack that includes a lower conductive layer 1620, an electric isolation layer 1630, and an upper conductive layer 1640. For example, the circuit substrate may be a DBC substrate and, in these embodiments, the lower conductive layer 1620 and the upper conductive layer 1640 are made up of a thickness of copper and the upper conductive layer 1640 is provided with a desired pattern to support circuit functionalities and mate with electric component modules or chips 1650. In the DBC substrate embodiment, the isolation layer 1630 may be AlN or another useful ceramic material.

As shown, a plurality of electric component modules or chips 1650 are applied over the top layer of the circuit substrate 1640. As discussed previously, the modules 1650 may include a silicon die or element layer that is soldered or otherwise bound to the upper conductive layer 1640. The modules 1650 are positioned such that the openings 1516 are adjacent or directly beneath the modules 1650 such that during operation, heat generated by the modules 1650 is at least partially dissipated through the circuit substrate layers 1650, 1640, 1630 to coolant in the opening 1516. In a typical manufacturing process, the spreader plate 1510 is prepared as shown in FIG. 15 and then, the circuit substrate with layers 1620, 1630, and 1640 and modules 1650 (which were assembled in a separate step(s)) are positioned on the plate 1510 with the lower conductive layer 1620 contacting the bonding and sealing layer 1520. If soldering is utilized, the layer 1520 is heated and allowed to cool to effect bonding between the upper surface of the plate 1510 and the lower conductive layer 1620 of the circuit substrate. In this bonding step, a seal is also created between the plate 1510 and the lower conductive layer 1620.

The assembly 1600 was modeled to determine exemplary effectiveness of the low thermal resistance design. In the model, the modules 1650 were assumed to be IGBT's in a silicon die that were 10 mm by 10 mm, designed to operate below 125° C., and had a 90 W/cm² heat flux. Coolant or cooling medium that flowed over the lower surface of the heat sink or spreader plate 1510 (and into openings 1516) was assumed to have an inlet temperature of 90° C. The spreader plate 1510 was assumed to be a metal with a thickness of 3 to 6 mm. The electric substrate was a DBC substrate with an AlN layer sandwiched between two copper layers. The two bonding layers were assumed to be made up of a solder material, and specifically, 90Pb-10Sn solder. A uniform heat transfer coefficient of 50,000 W/m²K was used on the heat sink side. In addition to the inventive configuration, a conventional configuration with a solid spreader plate and a bonding material of thermal grease was modeled as was a configuration with a solid spreader plate and a bonding material of solder material.

Figure 17:
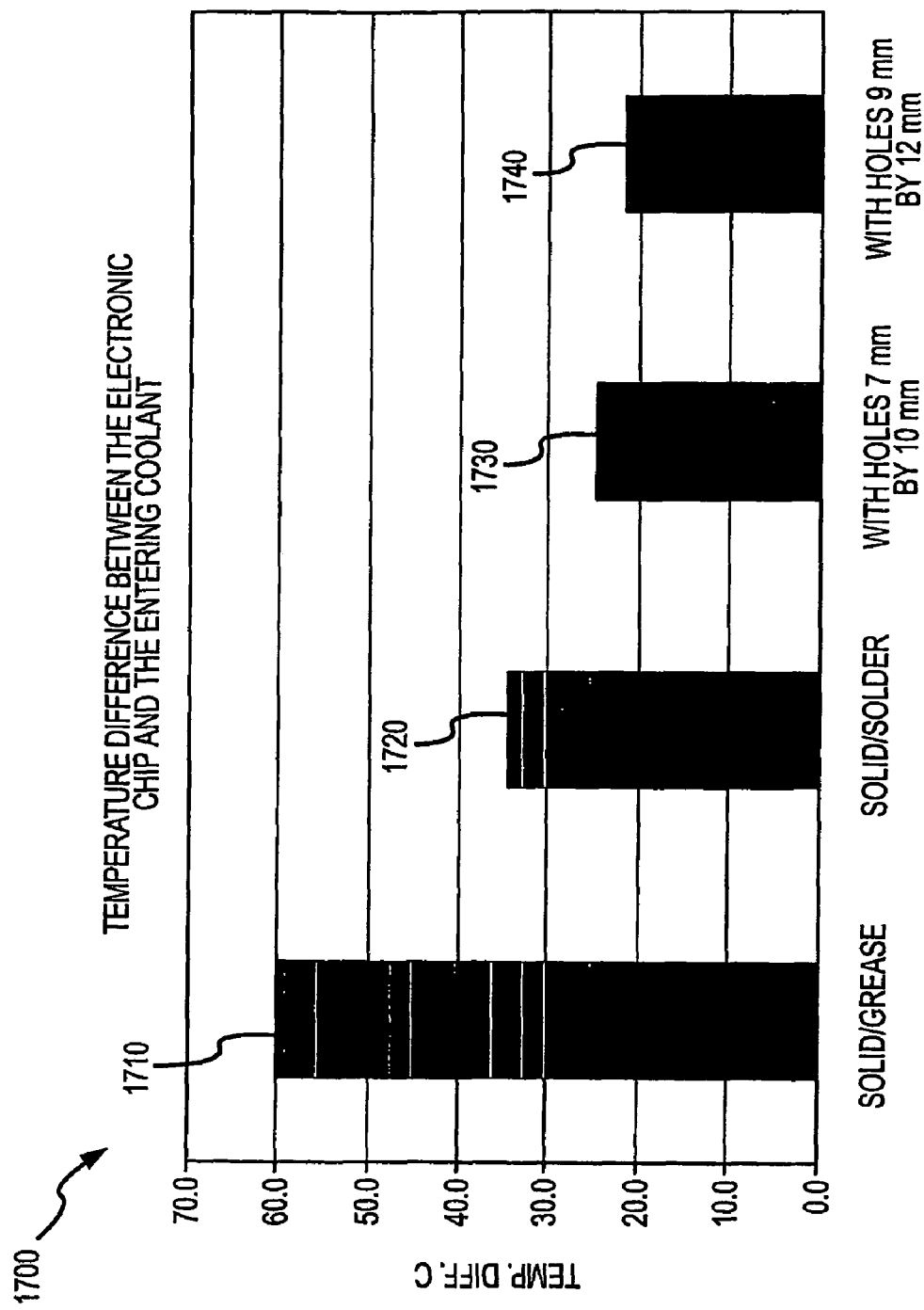
FIG. 17 is a bar graph illustrating temperature difference between coolant and IGBT in modeling of conventional power module assemblies and power module assemblies.

A portion of the modeling results is illustrated in the bar graph 1700 of FIG. 17. The graph 1700 shows the temperature difference between the coolant and the power module during operation of the various configurations. As will be appreciated, it is highly desirable to reduce the temperature difference required to maintain the power or other modules at desired operating temperatures. As shown by bar 1710, the modeled temperature difference for a conventional solid plate with thermal grease bonding material was 60° C. A large improvement was achieved in a configuration using solder material for the bonding material which is shown by bar 1720 to result in a temperature difference of about 34° C.

An even larger or significant improvement is achieved when a spreader plate with heat coolant passageways is utilized. Bar 1730 shows the results of modeling a tapered passageway design with a lower diameter of 10 mm and an upper diameter of 7 mm (e.g., adjacent the circuit substrate). As can be seen, the temperature difference has been reduced to about 24° C. or less than 50 percent of the difference of a conventional configuration. If the opening dimensions are increased to a lower diameter of 12 mm and an upper diameter of 9 mm, the temperature difference is even further reduced to about 21° C. as shown by bar 1740.

The effectiveness of the low thermal resistance embodiments of the preferred embodiment are verified with this modeling, and it should be readily apparent that power module assemblies can be produced with thermal resistance between the silicon die (or power module) and the heat sink being reduced by up to 50 percent or more. Stress distribution modeling was also performed, and it was determined that passageways or openings through the spreader plate or heat sink can be utilized while maintaining the stress and deflection levels within acceptable ranges for power module assemblies such as standard operating requirements for IGBT stacks (although, of course, the maximum size of such passageways (or amount of overlap length, $L_O$) should be selected to suit the particular materials, layer thicknesses, and other design parameters). Additional details from the modeling are provided in the following table.

|  | | Cooling Plate | | |
| --- | --- | --- | --- | --- |
|  | Solid | Solid | With openings of 7 mm upper diam and 9 mm lower diam. | With openings of 9 mm upper diam and 12 mm lower diam. |
| Substrate Bonding Material | Thermal Grease | Solder | Solder | Solder |
| Max. Temp. of Power Module | 149.9° C. | 124.3° C. | 114.5° C. | 111.4° C. |
| Coolant Temperature | 90° C. | 90° C. | 90° C. | 90° C. |

If a maximum operating temperature of the power module is assumed to be 125° C., it can be seen by the values of the model provided in the above table that the use of coolant passageways or openings is useful for maintaining the modules well below this temperature.

In some proposed applications of the low thermal resistance power module assembly (or IGBT) of the preferred embodiment, thermal stresses or stresses caused by expansion and contraction may be an issue or concern. For example, the use of a solder or other rigid bond between the circuit substrate and the spreader plate or heat sink could be problematic. Specifically, a mismatch between the coefficient of thermal expansion (CTE) between the solder or bonding layer shown and/or described in FIGS. 4-17 and the materials it is bonded to in the proposed assemblies could result in the thermally induced stress exceeding the yield stress of the solder or bonding layer. In applications where large temperature variations are expected, e.g., variations between −40° C. and 125° C. (or similar fluctuations), the bonding layer may split or delaminate, which may result in unacceptable seepage or leakage of coolant. Hence, there is a need for embodiments that address these large temperature swings and provide a liquid tight seal while retaining (or in some cases, improving) the significant improvements in power module cooling achieved by the embodiments described in FIGS. 4-17.

One technique for addressing large temperature swings is to include a stress resistant element or section (or strain accommodating layer) in the spreader plate. This stress resistant element acts to define the coolant passageway or opening while providing a bonding arrangement with the circuit substrate (e.g., DBC) that is liquid tight but is not detrimentally affected by temperature variations. Under this technique, FIGS. 18-24 illustrate two embodiments that use bellows in the stress resistant element or section such that the bonded portion of the spreader plate is able to expand and contract somewhat independent of the circuit substrate. As will become clear from the description of FIGS. 18-24, two exemplary configurations for the bellow is a typical "W" bellow and a less typical square bellow.

Figure 18:
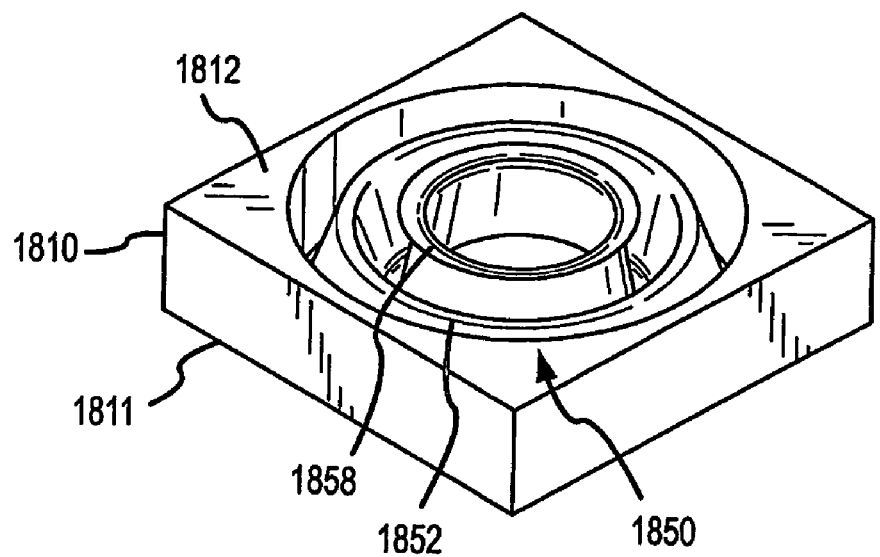
FIG. 18 is a perspective view of another embodiment a spreader plate or heat sink of an IGBT or power module assembly configured with a stress resistant element or section for defining the coolant passageway or opening and also to provide a mating surface for the circuit substrate or DBC.
Figure 19:
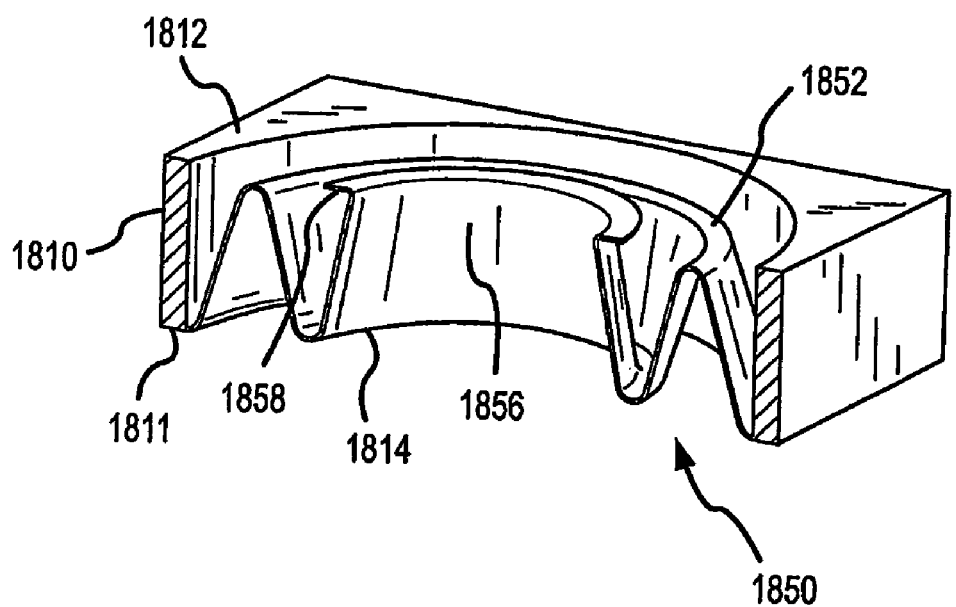
FIG. 19 is a perspective cut away view of the spreader plate of FIG. 18 further illustrating the bellow configuration of the stress resistant element or section.

FIGS. 18-21 illustrate use of a stress resistant element or member, with a W-shaped bellow, that extends about the periphery of each coolant passageway or opening (or can be thought of as defining the opening). With reference first to FIGS. 18 and 19, a spreader plate is illustrated 1810 that could be used to mate with and cool a single power module or circuit element (as shown in FIG. 4, for example). The spreader plate 1810 is typically made of a metal, such as aluminum, or other material with a high heat transfer coefficient. The spreader plate 1810 includes a lower surface 1811 that in use would contact the coolant or cooling medium (not shown) and an upper surface 1812 that would be adjacent or proximal to the circuit substrate and power module/circuit element.

Significant to addressing thermally-induced stresses, the spreader plate includes a stress resistant member or section 1850 that includes an inner wall 1856 which defines the coolant passageway or opening 1814 in the plate 1810. As shown, the inner wall 1856 has a circular cross section that gradually is reduced in diameter from the end proximate the lower surface 1811 to the upper surface 1812. At the end of the wall 1856 proximate the upper surface 1812, a bonding surface 1858 is provided that extends continuously (or seamlessly) about the periphery of the wall 1856 (or opening 1814) such that when a bonding layer (such as solder) is applied to the bonding surface 1858, a continuous seal can be achieved. The bonding surface 1858 is typically, but not necessarily, substantially co-planar with the upper surface 1812 of the spreader plate 1810. When a bonding layer or layer of solder (shown as 1822 in FIG. 20) is applied to the plate 1810, the bonding surface 1858 of the wall 1856 is coated and then, when a circuit substrate (element 1820 of FIG. 20) is mated with the plate 1810 the substrate is bonded to the plate 1810 at the bonding surface 1858 (as is shown in FIG. 20).

To allow the stress resistant member 1850 to contract and expand, a bellows section 1852 is provided that extends from the inner wall 1856 to mate with the plate 1810 (such as at the lower surface 1811 (but could mate with the upper surface 1812). Any number of bellows may be provided in this section 1852, with one bellow being shown for exemplary purposes. The bellow section 1852 allows independent movement of the stress resistant member 1850 as it does not extend to the upper surface 1812 (or the lower surface) with its peak or hump being lower or not coplanar with the upper surface 1812 (or lower surface 1811) and the bellow peak or hump is not bound to the circuit substrate or DBC (as shown in FIG. 20).

In other words, the span of the bellow section 1852 is less than the thickness of the spreader plate 1810. The distance from the bonding surface 1858 to the upper surface 1812 of the plate 1810 may vary, and is not limiting and will depend on the size or diameter of the opening 1814 used to cool a power module or circuit, the material of the plate and stress resistant member 1850, and the expected temperature variations (i.e., how much contraction and expansion must be accounted for). The stress resistant element 1850 may be formed in a number of fashions, and in one embodiment, the element 1850 and bellows 1852 are formed in the plate 1810 by stamping.

Figure 20:
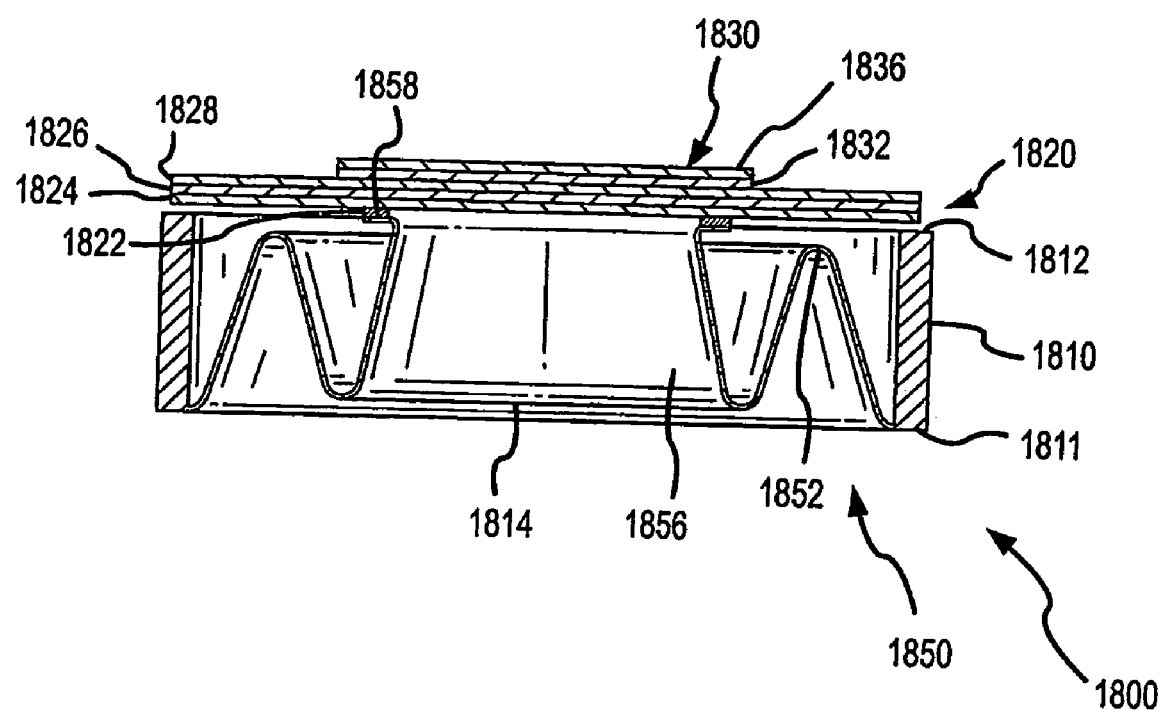
FIG. 20 is cross sectional view of a power module incorporating the spreader plate of FIGS. 18 and 19 showing the mounting of the DBC or circuit substrate to two surfaces of the plate, i.e., an outer and an inner bonding area on the upper surface of the plate.

FIG. 20 illustrates a power module assembly (or IGBT structure) 1800 that includes this spreader plate 1810 design. As shown, the assembly 1800 includes a spreader plate 1810 with a stress resistant member 1850 with bellow 1852. A circuit substrate 1820 is bonded to the plate 1810 via a bonding layer 1822 that is a nonporous material that may be selected to have a high heat transfer coefficient (e.g., a metal solder or the like). The substrate 1820 is bonded to the plate 1810 at the bonding surface 1858 of the stress resistant member 1850. This bonding site is continuous so that a liquid tight seal is formed between the plate 1810 and the substrate 1820, such that coolant flowing into the passageway 1814 is able to contact the substrate 1820 but is blocked from reaching the power module 1830 or electronics portions of the assembly 1800. The width and/or thickness of the seal may be varied to practice the preferred embodiment, with the width typically being defined, in part, by the width of the bonding surface 1858 of the inner wall 1856.

As shown, the circuit substrate or DBC 1820 includes two conductive layers (e.g., copper layers) 1824, 1828 between which is sandwiched a ceramic isolation layer (or AlN layer) 1826. On top of the circuit substrate 1820 is mounted a power module or circuit element 1830 that includes a circuit or die layer 1836 and a bonding layer 1832 (such as solder or the like) for rigidly attaching the power module 1830 to the circuit substrate 1820. The power module 1830 is preferably positioned within the assembly 1800 such that the module 1830 is directly above or is adjacent the passageway or opening 1814 in the spreader plate 1810 such that heat is effective transferred from the power module 1830 through the substrate 1820 to the coolant (not shown) flowing in the passageway 1814. As thermally-induced stresses develop in the assembly 1800, the stress resistant member 1850 is able to expand in the bellows 1852 such that yield stresses of the bonding layer 1822 forming the joint or seal between the bonding surface 1858 and the substrate conductive layer 1824 are not exceeded, thereby preventing or controlling delamination.

Figure 21:
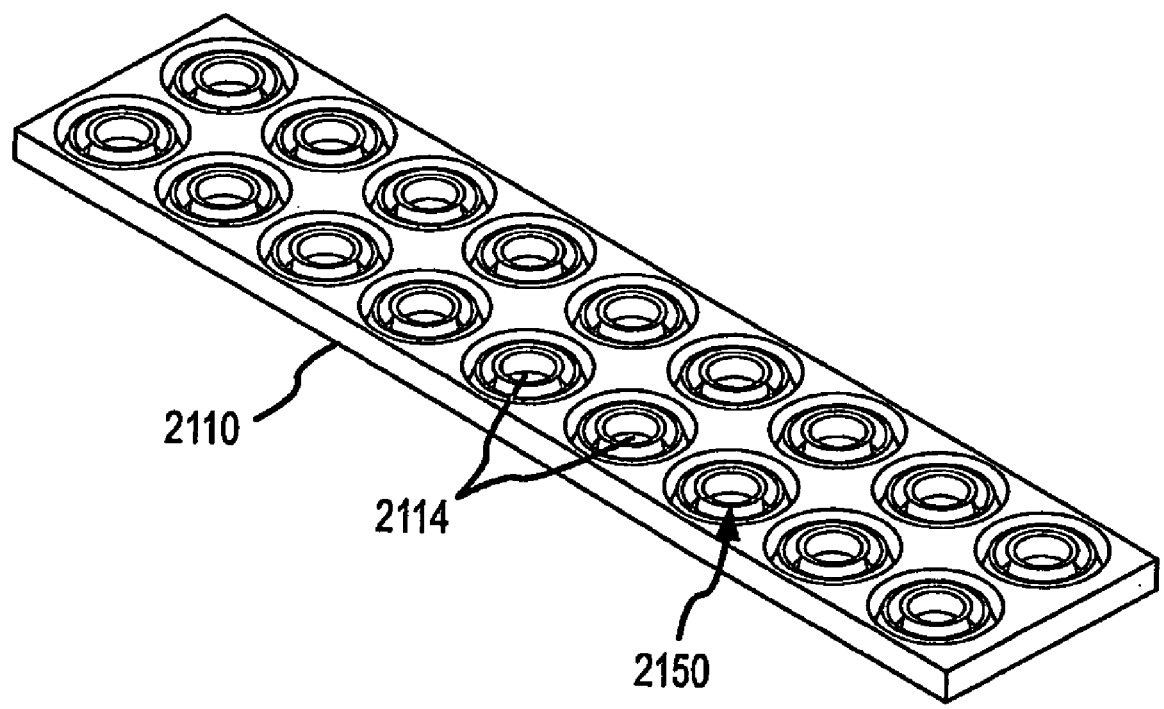
FIG. 21 illustrates another spreader plate that provides a 2 by 8 arrangement of bellowed coolant passageways or openings, i.e., a plate including sixteen coolant passageways configured similar to those shown in FIGS. 18-20.

As shown in FIG. 15, it may be more common for the coolant passageway concept to be used to cool a plurality of power modules or electric circuit elements rather than just a single module or element. In this regard, FIG. 21 illustrates a spreader plate 2110 that includes a plurality of passageways 2114 that are formed through the use of a plurality of stress resistant members 2150 formed in the plate 2110 (e.g., by stamping or other methods). The configuration is particularly useful for presently marketed IGBT assemblies or structures that include 18 power modules provided in a 2 by 9 array but, of course, this specific arrangement of the passageways 2114 and stress resistant members 2150 can be varied to suit a particular layout of power modules or circuit elements that require cooling. When the plate 2110 is used in an assembly (such as the assembly 1800 of FIG. 20), a layer of solder or other bonding material can be applied to coplanar bonding surfaces of the stress resistant members 2150 so as to thinly cover those surfaces of the resistant members 2150. Then, a circuit substrate is applied to the plate 2110 to achieve bonding and liquid tight seals (i.e., a continuous circular seal for each member 2150 as discussed with reference to FIGS. 18-20). The fabrication of such an IGBT or power module assembly is discussed in detail with reference to FIGS. 15 and 16 and would be applicable to the plate 2110.

Figure 22:
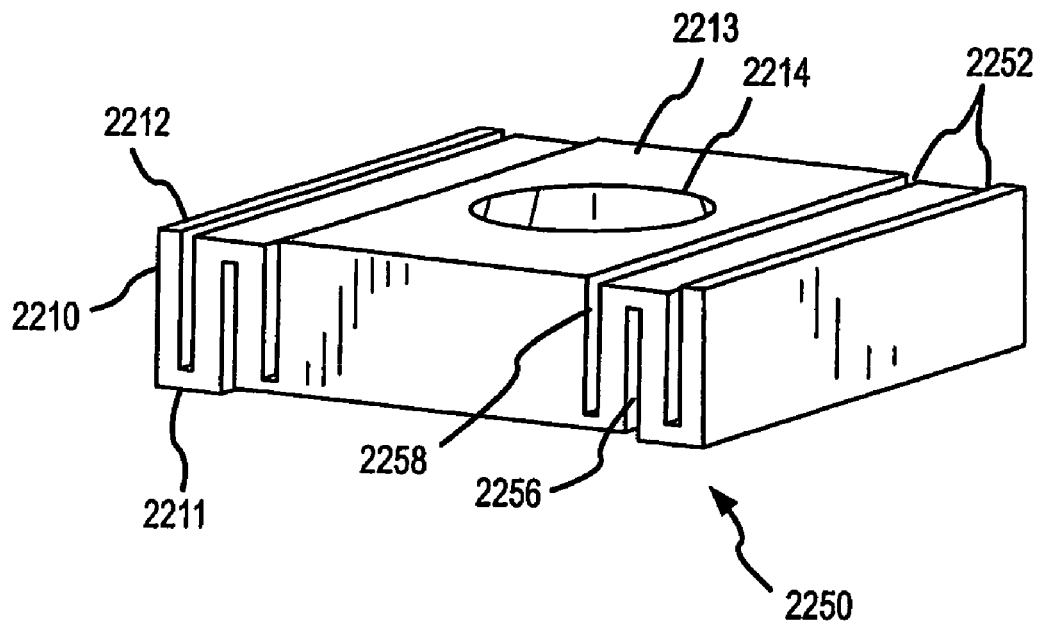
FIG. 22 is a perspective view of another spreader plate embodiment with a single coolant passageway and a pair of stress resistant elements or sections configured as square bellows.
Figure 23:
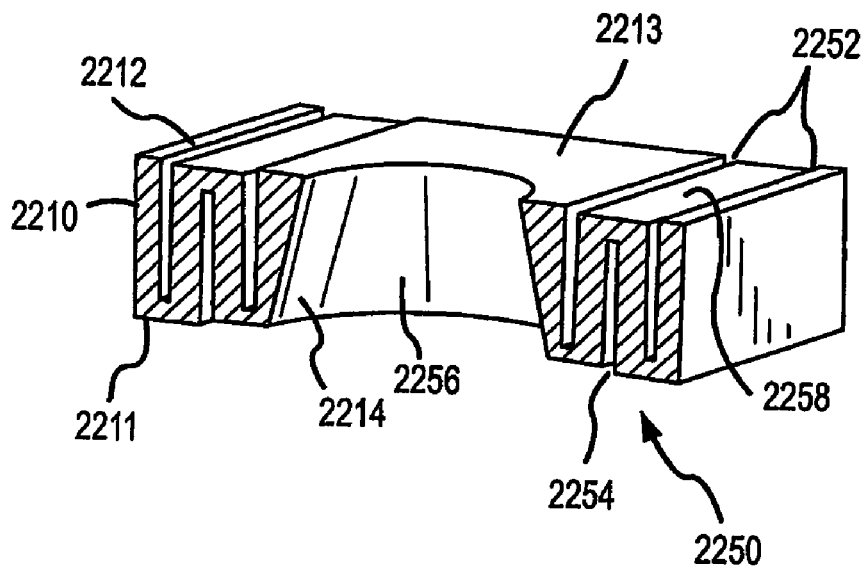
FIG. 23 is a perspective cut away view of the spreader plate of FIG. 22.
Figure 24:
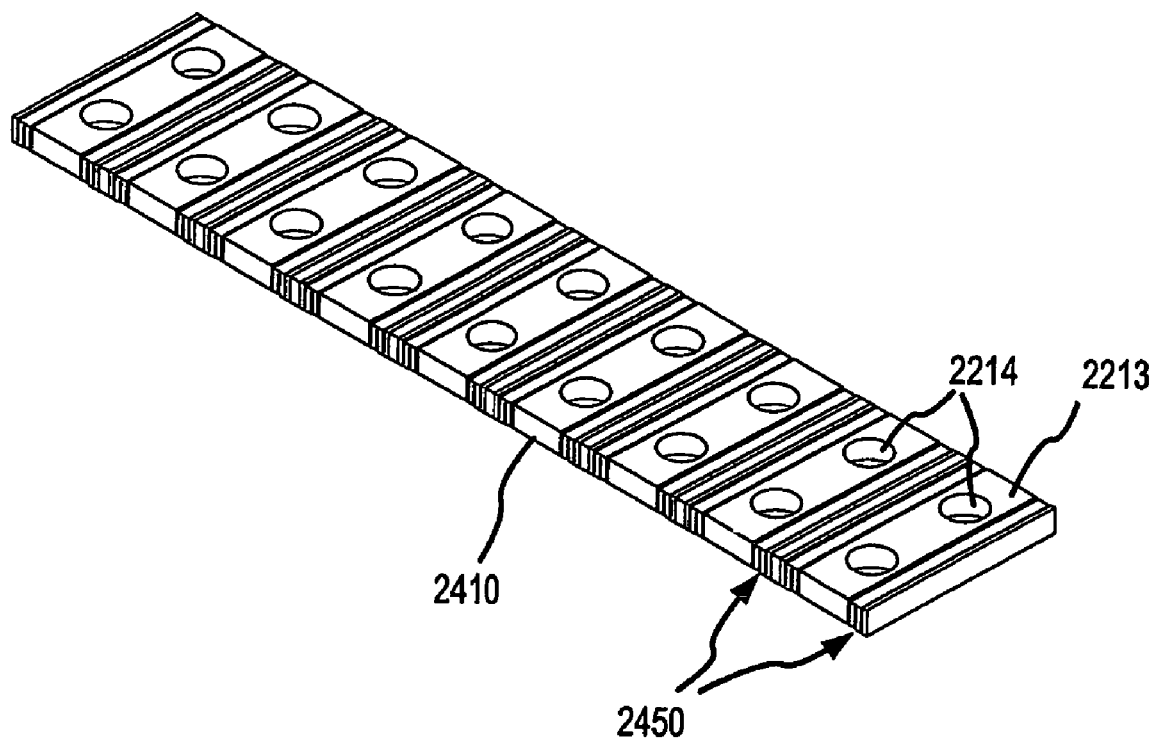
FIG. 24 is a perspective view of a spreader plate similar to that of FIG. 21 with a 2 by 9 arrangement of bellowed coolant passageways or openings using the bellow arrangement of FIGS. 22 and 23 and illustrating how the bellow grooves can be provided during manufacture of the plate.

In FIGS. 22-24, a "square" bellow embodiment of a stress resistant member is illustrated. Referring to FIGS. 22 and 23, a spreader plate or heat sink 2210 is shown for use in a power module assembly (such as a replacement for plate 1810 in assembly 1800). The spreader plate 2210 includes a pair of stress resistant members 2250 extending along and adjacent a coolant passageway or opening 2214 formed in the plate 2210. The opening 2214 is shown as being circular with a taper, such that the opening 2214 is larger in diameter at the lower surface 2211 of the plate 2210 than at the upper surface 2212. However, other opening 2214 cross sections may be utilized as discussed above. To form the square bellow in each stress resistant member 2250 a pair of grooves or slots are provided in the plate 2210 that extend downward from the upper surface 2212 toward (but not to) the lower surface 2211. Also, a single groove or slot 2256 is provided in the plate 2210 that extends upward from the lower surface 2211 toward (but not to) the upper surface 2212. Of course, the number of slots may be altered to provide more bellows and the number extending from each surface 2211, 2212 may be varied to practice the preferred embodiment. Additionally, the width and depth of the slots 2252, 2256 may be varied to achieve a desired bellow action in the stress resistant member 2250.

A recessed surface 2258 is provided in the upper surface 2212 between the two grooves 2252 such that the recessed surface 2258 is not coplanar with the adjacent portions of the upper surface 2212 and will not be bound by a bonding layer to a circuit substrate. In this manner, the recessed surface 2258 is similar to the peak or hump of the bellow 1852, which allows the stress resistant member 2250 to accommodate differing expansion and contraction between the plate 2210 and an attached circuit substrate. Although not shown, in practice, a bonding layer would be applied to part of the upper surface 2212 (namely, surface 2213) of the plate 2210 and a circuit substrate (or a conductive layer of such a substrate) would be mated with the plate 2210 (namely, surface 2213) by the bonding material. As with the assembly 1800, a seal is formed because a seal is formed about the periphery of the opening 2214 between the upper surface 2213 adjacent the opening 2214.

FIG. 24 illustrates a spreader plate or heat sink 2410 similar to those shown in FIGS. 15 and 21 that is used to provide a plurality of coolant passageways or openings 2214, which would be used, in turn, to cool a plurality of power modules or circuit elements. As shown, the openings 2214 are arranged in a 2 by 9 array. A pair of stress resistant members 2450 with "square" bellows are provided to allow bonding with circuit substrate (not shown) so as to prevent coolant from flowing from the passageways 2214 while accommodating thermally-induced stresses. In fabricating the plate 2410, each stress resistant member 2450 is formed by cutting two grooves or slots in the upper surface, forming the recessed surface between the grooves, and cutting a groove or slot in the lower surface of the plate. A bonding layer (e.g., a layer of solder) is applied to portions of the upper surface 2212 (namely, surface or portion 2213) and a circuit substrate (or conductive layer of such a substrate) is placed on the bonding layer. As a result of this bonding, a seal is formed between the plate upper surface 2213 and the circuit substrate adjacent the openings 2214 (e.g., about the periphery of the openings 2214). In practice, the stress resistant members 1850, 2250, and 2450 mitigate excessive stress in the bonding or solder layer of power module assemblies. These members 1850, 2250, and 2450 help the bonding layer or solder or other material in such a layer to deform and match the coefficient of thermal expansion of the substrates it is bonded to, thus limiting the developed stresses.

While a metallic bonding layer can provide an effective heat transfer path, there are other considerations such as cost and manufacturing complexity that provide an incentive to provide a seal between the spreader plate and the circuit substrate without a rigid physical bond. To this end, the defined embodiments may achieve a liquid tight seal between these components by providing a flexible sealing member, such as a gasket, O-ring, or the like, between the plate and the circuit substrate and then, forcing the plate and circuit together, e.g., by applying a force to the circuit substrate at one or more points proximal to the location of the sealing member. In these embodiments, if the compressible and/or resilient sealing member can provide an adequate liquid seal in power module assemblies, any mismatch between the coefficient of thermal expansion between the copper or other conductive material of the substrate and the aluminum or other high heat transfer rate material of the spreader plate is not an issue because the strains would not be coupled. The two layers or components in the power module assemblies are able to slide independently in response to temperature variations with minimal or no effect on the seal.

Figure 25:
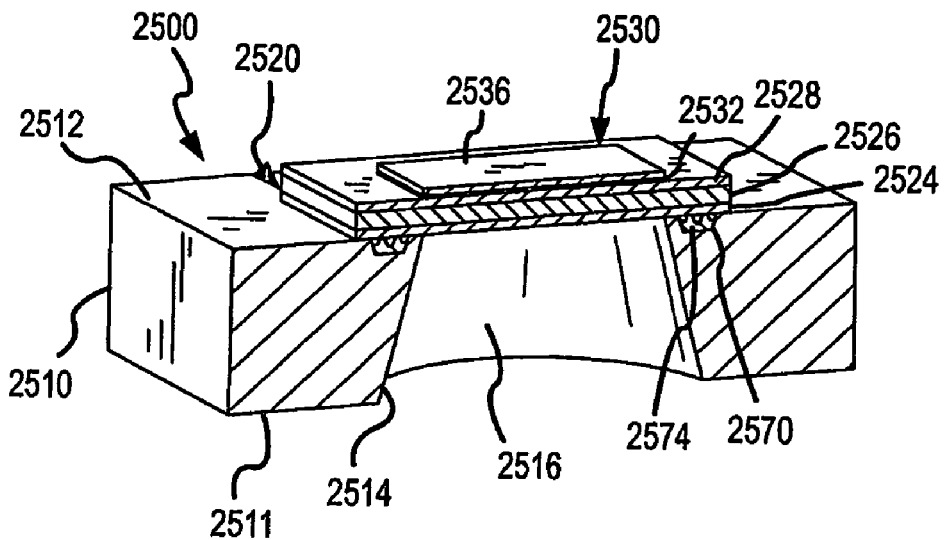
FIG. 25 is a perspective view of a cross section of yet another embodiment of a power module which is configured with to use a resilient (or compressible) sealing member (such as a gasket or O-ring) to achieve a seal to eliminate the need for a bonding layer (e.g., a solder or other bonding material layer) between the circuit substrate or DBC and the spreader plate.
Figure 26:
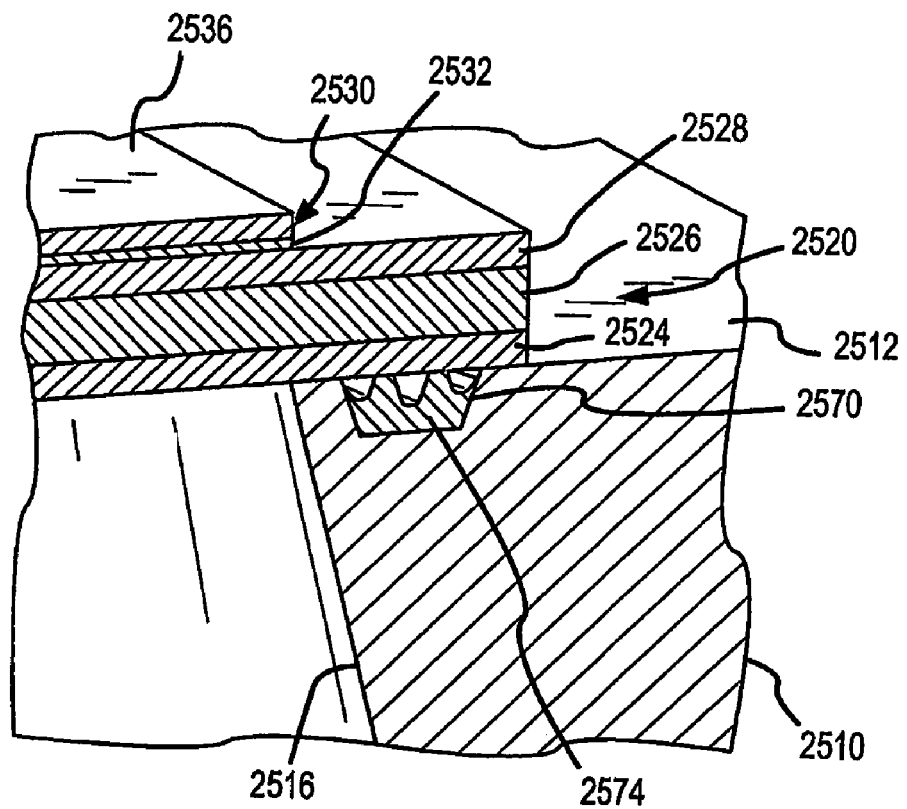
FIG. 26 is a detailed view of the sealing member and groove provided in the spreader plate shown in FIG. 25.

FIGS. 25 and 26 illustrate a power module assembly 2500 configured with a liquid tight seal between a circuit substrate 2520 and an upper surface 2512 of a spreader plate or heat sink 2510. The seal is achieved without a bonding or solder layer but is instead achieved by providing a recessed surface (or groove or slot) 2570 in the upper surface 2512 of the plate 2510 for receiving a sealing member 2574 (such as a gasket or O-ring or the like). The groove or slot 2570 extends in the upper surface 2512 in a continuous manner about the opening 2514 defined by the inner wall 2516 in the plate 2510. The opening 2514 has a circular cross section in the illustrated embodiment that decreases in size or diameter from the lower surface 2511 of the plate 2510 to the upper surface 2512, but any of the other configurations described herein may be used with the power module assembly 2500.

The specific groove or slot 2570 configuration may vary considerably to practice the preferred embodiment and is generally selected to provide a space for receiving the selected sealing member 2574. For example, a cross section that is more oval, circular, square, rectangular, or other shape may be used rather than the trapezoidal cross section shown. Similarly, the depth of the groove or slot 2570 is selected such that the sealing member 2574 when compressed by a sealing force applied to the substrate 2520 is able to substantially fill the groove or slot 2570 or to otherwise achieve a desired seal. The groove or slot 2570 is spaced apart from the wall 2516, with the space being selected for structural integrity and strength purposes and varying with the depth of the slot 2570 and the material used for the plate 2510.

In some embodiments, the sealing member 2574 is an O-ring, such as a double seal silicon O-ring shown in FIG. 26 that is suitable for a wide temperature range and is relatively inexpensive. The principle goals in choosing an O-ring for use in the assembly 2500 is threefold. First, it is desirable to find a material that is resistant to whatever coolant or cooling fluid used with the assembly 2500. Second, the O-ring should be selected to have an effective operating range that coincides with the anticipated operating temperatures for the module assembly 2500. Third, it is desirable to select an O-ring that can effectively provide a seal in the anticipated sealing forces while causing minimal impacts on the hardware (i.e., not require substantial changes to the IGBT or other power module structure). Further, it is desirable for the O-ring or gasket to be useful without requiring modification of the bottom of the substrate 2520. As noted, an exemplary O-ring may be a commercially available double seal O-ring made of silicon that provides excellent sealing characteristics and is resistant to most fluids (such as those used as coolant in the automotive industry such as ethylene glycol and water) and has an effective operating temperature range of −40° C. and 125° C., which is acceptable for many applications.

As shown in FIGS. 25 and 26, the power module assembly 2500 includes a spreader plate 2510 upon which a circuit substrate 2520 is positioned. The circuit substrate 2520 includes a pair of conductive layers 2524, 2528 between which a ceramic insulator layer 2526 is sandwiched. However, there is no bonding layer provided between the circuit substrate or DBC 2520 and the upper surface 2512 of the plate 2510. Instead, as shown, a seal is obtained with the sealing member 2574 that is placed in a slot or groove 2570 in the plate 2510. A sealing or compressive force is applied to the substrate 2520 such as with a wall or other structural member that transmits forces to the circuit substrate in one or more locations to cause the bottom conductive layer 2524 to apply a force to the top of the sealing member 2574 and compress the sealing member 2574 in the groove 2570, i.e., typically to a point where the substrate 2520 and upper surface 2512 adjacent the groove 2570 come into abutting contact.

A power module 2530 is mounted on the circuit substrate 2520 and includes a power module (or other heat generating circuit element) 2536 and a bonding layer (such as solder) 2532 that binds the module 2536 to the upper conductive layer 2528 of the circuit substrate 2520. As discussed previously, the power module 2536 is typically positioned to be adjacent the opening 2514, such as with a center of the module 2536 generally aligned with a central axis of the opening 2514 (although this is not required).

Figure 27:
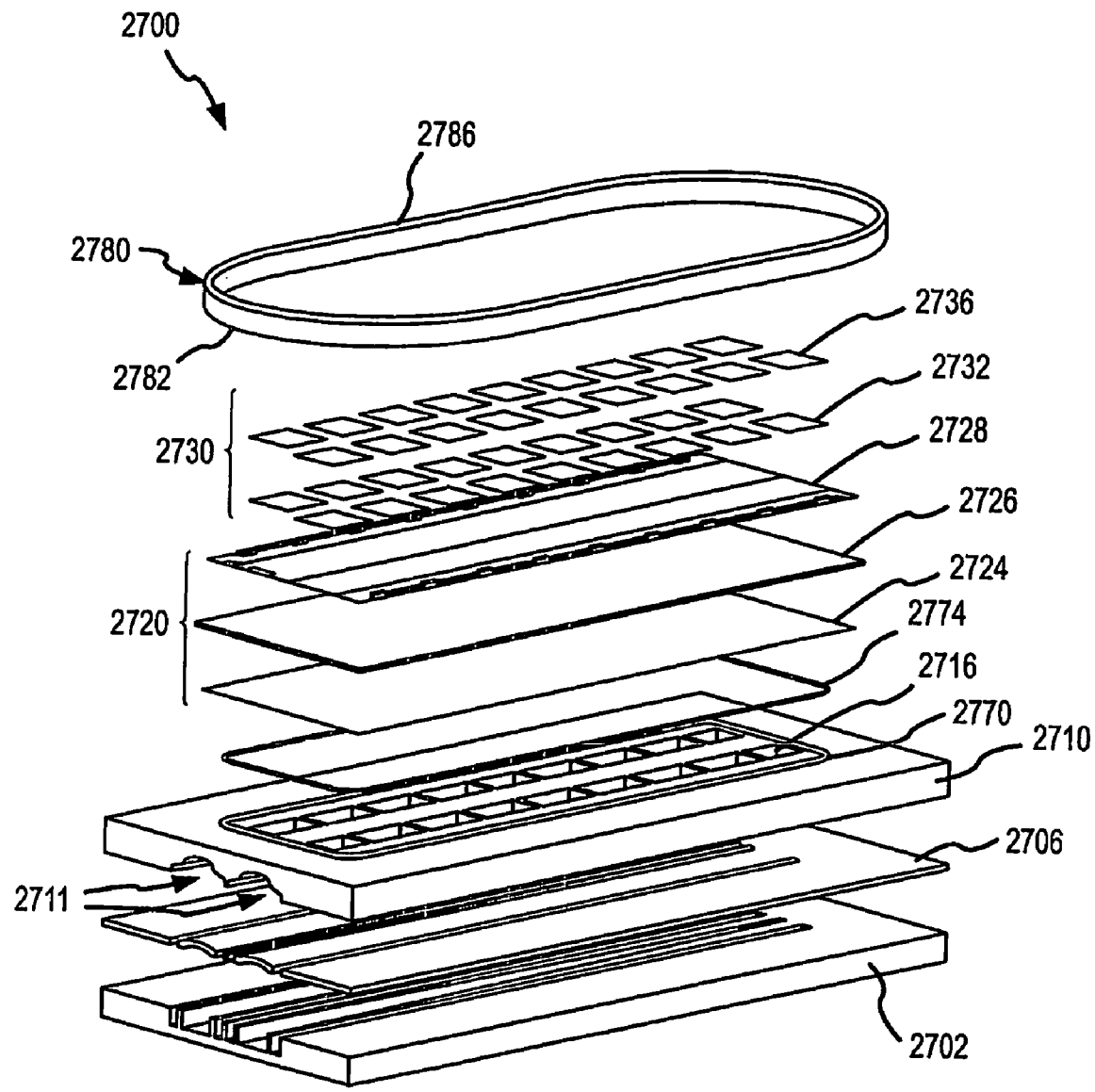
FIG. 27 is an exploded view of a power module assembly or IGBT structure that is configured similar to the modules shown in FIGS. 25 and 26 to provide a seal between the spreader plate, which contains 2 rows of 9 coolant passageways or openings, and the circuit substrate or DBC, which contains 18 power modules or other electronic elements.
Figure 28:
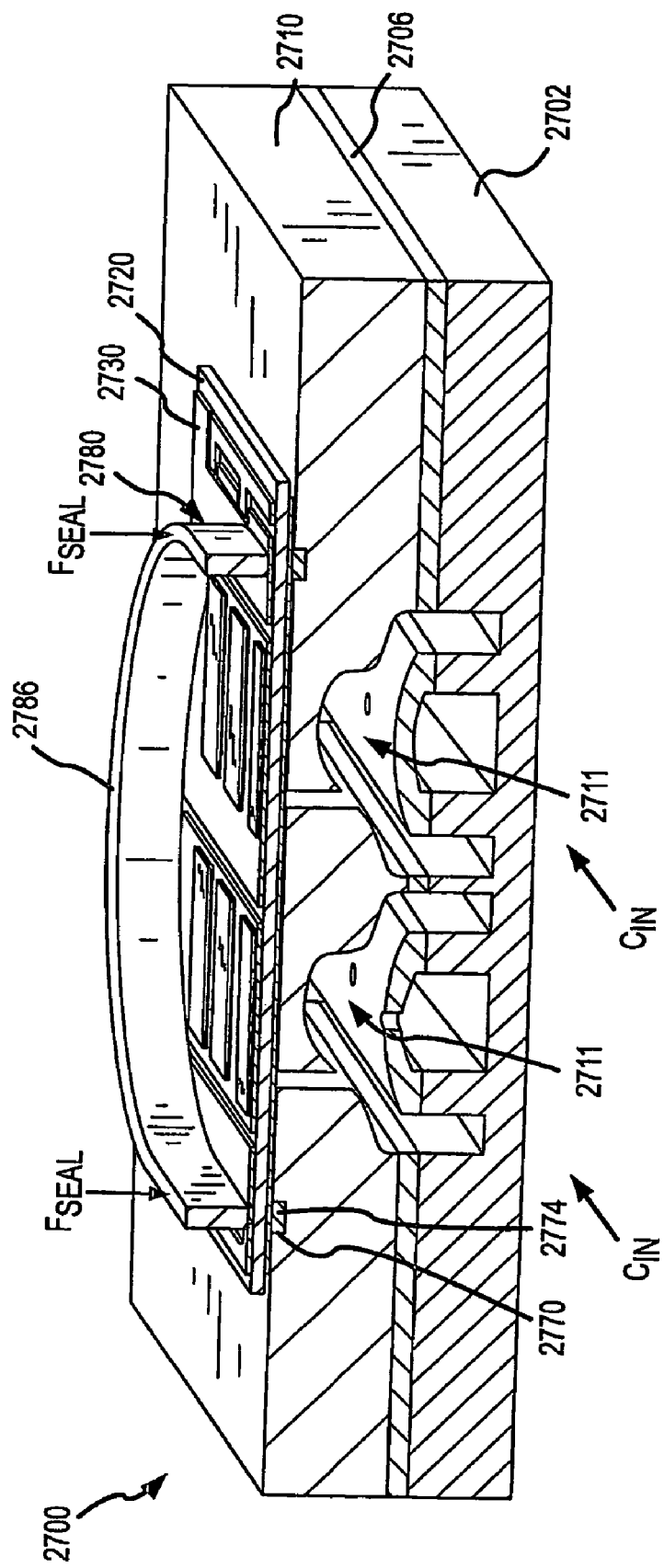
FIG. 28 is a cross section taken of the power module assembly or IGBT structure of FIG. 27 further illustrating the use of the sealing member to provide a seal between the spreader plate and circuit substrate when a sealing force is applied via a structural wall or member (e.g., a sealing force transmitting wall or member) abutting an upper surface of the circuit substrate, e.g., a surface substantially opposite a lower surface of the circuit substrate which is abutted or contacted by the sealing member.

The power module assembly 2500 includes a single opening 2514 and module 2536, but in many cases, it is desirable to cool multiple power modules. FIGS. 27 and 28 illustrate a power module assembly or IGBT structure 2700 that is useful for providing more effective cooling to a plurality of power modules or IGBTs 2736. FIG. 27 is an exploded view that is useful for understanding the manufacture or assembly of the power module assembly 2700. As shown, a flow channels plate or element 2702 is provided upon which a jet plate 2706 is mounted. Then, a base or spreader plate 2710 with flow paths 2711 for coolant or cooling fluid input to the assembly 2700 and passed to openings in the plate 2710 defined by sidewalls 2716 (i.e., 2 by 9 array of coolant passageways or openings in the plate 2710). The spreader plate 2710 (e.g., an aluminum or other high heat transfer material plate), the jet plate 2706, and the flow channel plate 2702 are configured to maximize the area exposed to impinging jets of coolant and are shown as being provided as individual components to reduce the cost of fabrication, e.g., casting with minimal machine finishing. However, these three components can also be fabricated as a single piece or as more than 3 pieces.

Significantly, in the upper surface of the spreader plate 2710 a recessed surface or groove 2770 is cut or provided for receiving a gasket, O-ring, or other sealing member 2774. As shown, the groove 2770 and sealing member 2774 are located about the periphery of the openings defined by walls 2716 and generally form a rectangular shape with rounded corners (but other shapes may be used depending on the arrangement of the openings in the plate 2710). One sealing member 2774 and groove 2770 are shown in the illustrated embodiment, but other embodiments may provide a separate groove/sealing member pair for each opening in the plate 2710 or for subsets of the openings (such as for each 2 openings in a row or for each 4 openings in 2 adjacent rows or the like).

On top of the sealing member 2774 and plate 2710, a DBC or substrate 2720 is provided that is made up of a pair of conductive layers 2724, 2728 between which is sandwiched a ceramic insulator layer 2726. No rigid bonding is required in the assembly 2700 with sealing being achieved by providing a wall or structural member 2780 that includes a lower surface 2782 that abuts the upper layer 2728 of the DBC 2720 to apply a sealing force (shown by "F" arrows in FIG. 28). The wall 2780 includes an upper surface 2786 to which the sealing force is applied, such as by an upper housing section (not shown) that may be included in a typical power module assembly to enclose and protect the modules 2730.

The "wall" 2780 may be a single, continuous piece as shown in FIGS. 27 and 28 or may alternatively be made up of two or more pieces that are spaced apart generally along (or more accurately, above) the track or run of the groove 2770 holding the sealing member 2774 (e.g., gasket, O-ring, or the like). For example, some available power module assemblies or IGBT structures are fabricated with a plurality of structural members that extend from an upper housing section to contact the top of a DBC to obtain good contacts when the housing section positioned and fastened in place, with the fastening (e.g. with screws or other fasteners that can be tightened force the housing section downward toward the DBC) applying a sealing force (e.g., 0 to 3000 pounds or more force depending on the configuration of the assembly and selection of material for the sealing member 2774) that is transmitted through the wall 2786 to the circuit substrate 2720 (to the upper conductor 2728) and then to the sealing member 2774 to obtain a liquid tight seal in the assembly 2700.

The cut-through design of the spreader plate, described in FIGS. 4-28, for power module assemblies such as IGBT structures has been shown by simulations to be an effective solution to the problem of minimizing the thermal resistance so as to provide improved cooling results. In the layout shown in assembly 2700, eighteen holes are defined by walls 2716 and are arranged in the assembly 2700 to lie directly below a paired power electronic die 2736. Between the hole or openings are bridges or connecting pieces to help distribute the force applied to the electrical contacts. These bridges help to support the phase of the inverter from excessive bending and reduce the risk of cracking. The cut through design of plate 2710 allows the jets of coolant fluid to impinge directly on the DBC 2720 to which the IGBTs 2736 and power diodes are typically soldered. A significant benefit of the cut through design is the elimination of the need/use of thermal grease, which increases thermal resistance.

Surrounding the cut through holes in the plate 2710 is a groove 2770 for a sealing member 2774, such as an O-ring, to seal the DBC 2720 and the upper surface of the plate 2710. The sealing member 2774 is made of a compressible and typically resilient material (such as silicon or the like) that provides a seal despite the difference in the coefficient of thermal expansion between the material of the DBC 2720 (e.g., copper or other conductive material) and the plate 2710 (e.g., aluminum or the lie) which results in differing expansions and contractions during operations of the assembly 2700. Eliminating rigid bonding of these two components allows the two surfaces or components to more freely expand and contract as the temperature varies, which decouples the strain and reduces the thermally induced stresses that could result in failure.

Designing the geometry of the groove 2770 for the O-ring or other sealing member 2774 is important to create an adequate seal. The force applied to the structure via the wall (or sealing force transmitting member) 2786 should be able to compress the sealing member 2774 such that the bottom copper layer 2724 of the DBC 2720 comes into complete contact with the aluminum cooling plate 2710 to avoid bowing which could lead to fracture. In addition, the seal should be able to isolate the coolant environment from the exterior of the device 2700. Any leaks could cause a short circuit and render the entire device dysfunctional.

A section view of the entire assembly 2700 can be seen in FIG. 28. The wall 2786 (which may also be provided by two or more structural members or pads) applies pressure directly to the top of the circuit substrate 2720. The location of the sealing member 2774 and groove 2770 was selected such that the sealing member 2774 lies substantially directly underneath the pressure contacts of the wall 2786 such that the sealing force is transferred more directly to the sealing member 2774 and reduces structural instabilities by limiting any moments. At least a portion of the bridges which separate the rectangular impingement zones in the plate are likewise positioned under the pressure contacts. This limits the bending of the DBC 2720, which can otherwise lead to cracking by exceeding the yield stress.

In order to sufficiently compare the utility and effectiveness of this new design, thermal analyses similar to that performed on the embodiments shown in FIGS. 4-17 was performed on the assembly 2700. Boundary conditions were applied to the model, and each of the IGBTs and power diodes 2736 (components 2736 may represent IGBTs, power diodes, or other electrical components or elements that generate heat and their number and position in an assembly 2700 may vary) were assigned an internal heat generation of 90 watts and 60 watts respectively. Assuming the dimensions of the silicon dies are 9 mm on a side, the heat generation rate is equivalent to 111 W/cm$^2$ and 74 W/cm$^2$ respectively. The thermal contours of the top and bottom for the IGBT structure 2700 with an O-ring for sealing member 2774 and cut-through structure of plate 2710 were determined, and the maximum temperature at the extremities in the lateral direction, i.e., at the two extreme IGBTs 2736 was determined. The results of the analysis are promising with the maximum temperature in the central region being 129° C. giving a maximum temperature rise of 24° C. from the inlet temperature of the coolant at 105° C.

If temperatures at the extremities are considered too high for a particular application of the assembly 2700, heat may be further dissipated with minor design or configuration changes to maintain the minimum temperature achievable. For example, a simple design change (or alternative embodiment of the assembly 2700) would be to extend the DBC 2720 in the lateral direction by a small amount such that the o-ring could be placed outside the boundary of the IGBT assembly 2720. This would allow the jets to impinge on the entire surface of the DBC 2720 opposite the power electronics and maximize the cooling effects. In addition, this would also allow additional pressure contacts to be added on the sides of the IGBT structure 2700 to transfer the force directly to the sealing member 2774 and limit the moment created in the current design. This would help ensure an adequate seal and reduce stress.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope. For example, the above examples show a planar heat sink provided in the form of a spreader plate, but a heat sink with fins, tabs, channels, and the like may be used in combination with the heat coolant passageways or openings. To further illustrate how the inventive concepts can be expanded, the plate 1510 of FIG. 15 may be modified to combine 2 or more of the coolant passageways. For example, the 18 passageways may be replaced with 2 passageways having an oval, elliptical, rectangular, or other shaped cross section, and these 2 passageways would extend substantially from one end to the other of the plate 1510 (e.g., the material between the illustrated passageways could be removed).

The invention claimed is:

1. A power module assembly with low thermal resistance, comprising:
    a heat sink plate with a lower surface and an upper surface, the heat sink plate comprising a plurality of passageways for coolant extending from the lower surface to the upper surface;
    a circuit substrate positioned on the heat sink plate covering the coolant passageways, wherein the heat sink plate further comprises a recessed surface on the upper surface extending continuously about the periphery of one or more of the coolant passageways;
    a sealing member positioned in the recessed surface of the heat sink plate, the sealing member comprising a compressible material; and
    a set of power modules mounted on the circuit substrate opposite a bonding layer,
    wherein each of the coolant passageways has a circular cross section with a sidewall extending from the lower surface to the upper surface of the heat sink plate, and
    wherein the sidewalls slope inward from the lower surface such that each of the coolant passageways has a diameter at the lower surface that is greater than a diameter at the upper surface of the heat sink plate.

2. The assembly of claim 1, wherein the sealing member is an O-ring or a gasket.

3. The assembly of claim 1, further comprising a structural member positioned to contact a surface of the circuit substrate opposite a surface of the circuit substrate covering the coolant passageways, wherein a sealing force is applied to the circuit substrate via the structural member to compress the sealing member.

4. The assembly of claim 1, wherein the power modules each comprise an insulated gate bipolar transistor (IGBT) module or a diode and the circuit substrate further comprises a direct bonded copper (DBC) substrate bonded to the bonding layer and to the IGBT module, the DBC substrate comprising a pair of layers of copper sandwiching a ceramic isolation layer.

5. An electronic assembly with low thermal resistance, comprising:
    a metallic spreader plate comprising a lower surface and an upper surface, a heat dissipation opening extending through the plate from the upper surface to the lower surface, and a stress resistant element adjacent the heat dissipation opening;
    a circuit substrate;
    a bonding and sealing layer disposed between the circuit substrate and the plate and bonding the circuit substrate to a portion of the upper surface of the plate adjacent the stress resistant element and to a bonding surface of the stress resistant element proximate to the heat dissipation opening; and
    an electric component layer positioned on the circuit substrate comprising an integrated circuit (IC) generating heat during operation, the heat being removed at least in part through the circuit substrate to a cooling medium in the heat dissipation opening, wherein the bonding and sealing layer blocks flow of the cooling medium between the circuit substrate and the plate.

6. The assembly of claim 5, wherein the bonding and sealing layer is positioned about the periphery of the heat dissipation opening, whereby the cooling medium in the heat dissipation opening contacts the circuit substrate.

7. The assembly of claim 6, wherein the bonding and sealing layer comprises a nonporous solder material.

8. The assembly of claim 5, wherein the stress resistant element comprises at least one bellow.

9. The assembly of claim 8, wherein the bellow is not bound to the circuit substrate with the bonding layer.

10. The assembly of claim 9, wherein the bellow has a W-shaped cross section and the stress resistant element extends about the periphery of the heat dissipation opening.

11. The assembly of claim 5, wherein the IC comprises an insulated gate bipolar transistor (IGBT) or a diode and the electronic component layer further comprises a silicon die and wherein the circuit substrate comprises a ceramic isolation layer between an upper and a lower layer of electrically conductive material, the lower layer being sealably bonded to the bonding and sealing layer and being at least partially exposed to the cooling medium in the heat dissipation opening.

12. A method of manufacturing a power module assembly with low thermal resistance, comprising:
providing a power module substrate comprising a plurality of power modules distributed in a pattern on a circuit substrate, the circuit substrate comprising a pair of electrical conductor layers with a ceramic isolation layer sandwiched between;
providing a metallic plate having a thickness, based on the power module pattern, making a hole through the thickness of the plate for each of the power modules;
forming a groove in an upper surface of the plate about the periphery of one or more of the holes;
positioning a sealing member in the groove; and
mating the plate to the power module substrate, wherein the holes in the plate are substantially aligned with the power modules with a central axis of the holes substantially aligned with a center of one of the power modules, the bonding comprising applying a sealing force to a portion of the circuit substrate to compress the sealing member and achieve a liquid seal between the upper surface of the plate and the circuit substrate,
wherein the holes are tapered with a diameter that increases with distance from the circuit substrate.

13. The method of claim 12, wherein sealing member is a gasket or O-ring comprising a compressible material and the sealing force is selected based on the gasket or O-ring to at least partially compress the sealing member.

14. The method of cairn 12, wherein the groove in the upper surface of the plate is located so as to define a path that encloses all of the holes.

15. The method of claim 12, wherein the applying of the sealing force comprises providing a sealing force transmitting member that contacts the portion of the circuit substrate and a housing enclosing the power module substrate.

16. The method of claim 12, wherein the power modules each comprise an insulated gate bipolar transistor (IGBT) in a silicon die and wherein the circuit substrate comprises a direct bonded copper (DBC) substrate.

17. The method of claim 12, wherein the providing of the power module substrate comprises providing the silicon dies with the IGBTs and the DBC substrate and then, bonding the silicon dies to the second one of the electrical conductor layers in the power module pattern.

18. A power module assembly with low thermal resistance, comprising a heat sink plate with a lower surface and an upper surface, said heat sink plate comprising a plurality of passageways for coolant extending from said lower surface to said upper surface; a circuit substrate positioned on said heat sink plate covering the coolant passageways, wherein each of said coolant passageways has a circular cross section with a sidewall extending from said lower surface to said upper surface of said heat sink plate; said sidewalls are oriented to slope inward from said lower surface such that each of said coolant passageways has a diameter at said lower surface that is greater than a diameter at said upper surface of said heat sink plate; said heat sink plate further comprising a recessed surface on said upper surface extending continuously about the periphery of one or more of said coolant passageways; a sealing member positioned in said recessed surface of said heat sink plate, said sealing member comprising a compressible material and comprised of an O-ring or a gasket; a set of power modules mounted on a circuit substrate opposite a bonding layer, wherein said power modules each comprise an insulated gate bipolar transistor (IGBT) module or a diode and said circuit substrate further comprising a direct bonded copper (DBC) substrate bonded to said bonding layer and to said IGBT module, said DBC substrate comprising a pair of layers of copper sandwiching a ceramic isolation layer; and a structural member positioned to contact a surface of said circuit substrate opposite a surface of said circuit substrate covering said coolant passageways, wherein a sealing force is applied to said circuit substrate via said structural member to compress said sealing member.

19. An electronic assembly with low thermal resistance, comprising a metallic spreader plate including a lower surface and an upper surface, a heat dissipation opening extending through said plate from said upper surface to said lower surface, and a stress resistant element adjacent said heat dissipation opening; a circuit substrate; a bonding and sealing layer disposed between said circuit substrate and said plate for bonding said circuit substrate to a portion of said upper surface of said plate adjacent said stress resistant element and to a bonding surface of said stress resistant element proximate to said heat dissipation opening, said stress resistant element comprising at least one bellow, said bellow is not bound to said circuit substrate with said bonding layer, said bellow has a W-shaped cross section and said stress resistant element extends about the periphery of said heat dissipation opening, said bonding and sealing layer is positioned about the periphery of said heat dissipation opening, whereby a cooling medium in said heat dissipation opening contacts said circuit substrate, said bonding and sealing layer comprising a nonporous solder material; and an electric component layer positioned on said circuit substrate comprising an integrated circuit (IC) for generating heat during operation, said heat being removed at least in part through said circuit substrate to a cooling medium in said heat dissipation opening, wherein said bonding and sealing layers block flow of said cooling medium between said circuit substrate and said plate, said IC comprising an insulated gate bipolar transistor (IGBT) or a diode and said electronic component layer comprising a silicon die, said circuit substrate comprising a ceramic isolation layer between an upper and a lower layer of electrically conductive material, said lower layer being sealably bonded to said bonding and sealing layers and being at least partially exposed to said cooling medium in said heat dissipation opening.

20. A method of manufacturing a power module assembly with low thermal resistance comprising, providing a power module substrate including a plurality of power modules distributed in a pattern on a circuit substrate, said circuit substrate comprising a pair of electrical conductor layers with a ceramic isolation layer sandwiched between, said power modules each comprising an insulated gate bipolar transistor (IGBT) in a silicon die, said circuit substrate comprising a direct bonded copper (DBC) substrate, wherein said providing of said power module substrate comprises providing silicon dies with said IGBTs and said DBC substrate and bonding said silicon dies to the second one of said electrical conductor layers in said power module pattern; providing a metallic plate having a thickness based on the power module pattern, making a hole through the thickness of said plate for each of said power modules; forming a groove in an upper surface of said plate about the periphery of one or more of said holes, said groove in said upper surface of said plate is located so as to define a path that encloses all of said hole; positioning a sealing member in said groove, said sealing member is a gasket or O-ring comprising a compressible material; and mating said plate to said power module substrate, wherein the holes in said plate are substantially aligned with said power modules with a central axis of said holes substantially aligned with a center of one of said power modules, said holes are tapered with a diameter that increases with distance from said circuit substrate, said bonding comprising applying a sealing force to a portion of said circuit substrate to compress said sealing member and achieve a liquid seal between said upper surface of said plate and said circuit substrate, said sealing force being selected based on said gasket or O-ring to at least partially compress said sealing member, wherein the applying of said sealing force comprises providing a sealing force transmitting member that contacts the portion of said circuit substrate and a housing enclosing said power module substrate.

* * * * *